(12) United States Patent
Jung et al.

(10) Patent No.: US 12,372,568 B2
(45) Date of Patent: Jul. 29, 2025

(54) HVDC CABLE PARTIAL DISCHARGE DIAGNOSIS SYSTEM AND METHOD

(71) Applicant: KOREA ELECTRIC POWER CORPORATION, Naju-si (KR)

(72) Inventors: Chae Kyun Jung, Daejeon (KR); Su Hwan Kim, Daejeon (KR); Ji Won Kang, Daejeon (KR)

(73) Assignee: KOREA ELECTRIC POWER CORPORATION, Naju-si (KR)

( * ) Notice: Subject to any disclaimer, the term of this patent is extended or adjusted under 35 U.S.C. 154(b) by 0 days.

(21) Appl. No.: 18/573,428

(22) PCT Filed: Jul. 6, 2022

(86) PCT No.: PCT/KR2022/009757
§ 371 (c)(1),
(2) Date: Dec. 21, 2023

(87) PCT Pub. No.: WO2023/282620
PCT Pub. Date: Jan. 12, 2023

(65) Prior Publication Data
US 2024/0288484 A1 Aug. 29, 2024

(30) Foreign Application Priority Data
Jul. 6, 2021 (KR) .................. 10-2021-0088454

(51) Int. Cl.
*G01R 31/08* (2020.01)
(52) U.S. Cl.
CPC ......... *G01R 31/088* (2013.01); *G01R 31/083* (2013.01)

(58) Field of Classification Search
None
See application file for complete search history.

(56) References Cited

U.S. PATENT DOCUMENTS

2009/0119035 A1* 5/2009 Younsi ................. G01R 31/343
702/58
2020/0382031 A1* 12/2020 Higgins .................... H02P 9/42

FOREIGN PATENT DOCUMENTS

| KR | 10-0999575 B1 | 12/2010 |
| KR | 10-1206554 B1 | 11/2012 |
| KR | 10-2013-0030585 A | 3/2013 |
| KR | 10-1945451 B1 | 2/2019 |
| KR | 10-2003966 B1 | 7/2019 |
| KR | 10-1969367 B1 | 8/2019 |
| KR | 10-2117208 B1 | 6/2020 |

* cited by examiner

*Primary Examiner* — Farhana A Hoque
(74) *Attorney, Agent, or Firm* — Benest Law Office PC

(57) ABSTRACT

Disclosed are a high-voltage direct current (HVDC) cable partial discharge diagnosis system and method. The HVDC cable partial discharge diagnosis system according to one aspect of the present invention comprises: a sensor provided on an HVDC cable; a plurality of HVDC cable partial discharge measurement devices for acquiring measurement result information from the sensor and detecting a partial discharge signal from the measurement result information; and an HVDC cable partial discharge diagnosis device which receives the partial discharge signal from the HVDC cable partial discharge measurement devices and diagnoses whether partial discharge has occurred in the HVDC cable, through pattern analysis of the partial discharge signal.

18 Claims, 19 Drawing Sheets

HVDC CABLE PARTIAL DISCHARGE DIAGNOSIS SYSTEM AND METHOD

CROSS-REFERENCE TO RELATED APPLICATIONS

This application claims the benefit under 35 U.S.C. section 371, of PCT International Application No. PCT/KR2022/009757, filed on Jul. 6, 2022, which claims foreign priority to Korean Patent Application No. 10-2021-0088454, filed on Jul. 6, 2021, in the Korean Intellectual Property Office, both of which are hereby incorporated by reference in their entireties.

TECHNICAL FIELD

The present invention relates to a high-voltage direct current (HVDC) cable partial discharge diagnosis system and method, and more specifically, to an HVDC cable partial discharge diagnosis system and method for diagnosing a partial discharge of an HVDC cable by analyzing a pattern of an HVDC cable partial discharge signal analyzed through partial discharge measurement of the HVDC cable.

BACKGROUND ART

In general, diagnosis of a partial discharge in long-distance submarine cables has limitations in the application of a diagnostic method due to various problems such as high-frequency signal attenuation and the like. Accordingly, high-voltage direct current (HVDC) cables which have formed a global market centered on submarine cables are currently lacking a commercialized technology for systematically diagnosing a partial discharge. However, with the recent increase in HVDC cable running and construction on land, various installation methods are being applied to HVDC cable systems, and connection boxes are increasing in HVDC cable systems. As a result, the need for a partial discharge diagnosis is emerging.

Diagnosis of an alternating current (AC) cable partial discharge has been extensively researched, and the most common method of determining the cause of a defect is phase resolved partial discharge analysis (PRPDA). PRPDA is a technique for analyzing and determining a pattern through the phase distribution of frequency-based partial discharge pulses by accumulating a phase, a charge amount, the number of occurrences, and the like according to an AC applied voltage. The reliability of PRPDA-related technologies is high.

Meanwhile, unlike an AC voltage, a direct current (DC) voltage has no phase, and thus it is not possible to apply PRPDA which is generalized as a method of analyzing a partial discharge pattern in an AC cable. Accordingly, to diagnose an HVDC cable partial discharge, a frequency-based PRPDA analysis technique which is used for diagnosing an AC cable partial discharge cannot be applied. Thus far, technological progress has been made in technologies for measuring a partial discharge and analyzing a partial discharge pattern in HVDC cables, but there are very few completed technologies available for partial discharge diagnosis. As conventional art, there is a result of research on a technology for measuring a partial discharge of an HVDC cable and a method of analyzing a pattern of an HVDC cable partial discharge signal analyzed through measurement. However, there is serious lack of commercialized technologies for diagnosing a partial discharge of an HVDC cable using this research result. Currently, diagnosis of a partial discharge of an HVDC cable is the only method of diagnosing whether there will be an HVDC cable failure in advance, and in the case of a land cable, the contribution to failure prevention is expected to be significant. Therefore, a reliable technology for diagnosing a partial discharge of an HVDC cable is very necessary.

The background art of the present invention is disclosed in Korean Patent Publication No. 10-0999575 (published Dec. 8, 2010).

DISCLOSURE

Technical Problem

The present invention is directed to providing a high-voltage direct current (HVDC) cable partial discharge diagnosis system and method for diagnosing partial discharge of an HVDC cable by analyzing a pattern of an HVDC cable partial discharge signal analyzed through partial discharge measurement of the HVDC cable.

Objectives of the present invention are not limited to that described above, and other objectives which have not been described will be clearly understood by those of ordinary skill in the art from the following description.

Technical Solution

One aspect of the present invention provides a (HVDC) cable partial discharge diagnosis system including sensors installed on an HVDC cable, a plurality of HVDC cable partial discharge measurement devices configured to acquire measurement result information from the sensors and detect a partial discharge signal from the measurement result information, and an HVDC cable partial discharge diagnosis device configured to receive the partial discharge signal from the HVDC cable partial discharge measurement devices and diagnose whether there is a partial discharge in the HVDC cable through pattern analysis of the partial discharge signal.

The HVDC cable partial discharge diagnosis device may include a first partial discharge diagnosis unit configured to make a primary partial discharge diagnosis through individual functions of pattern analysis of predefined items, a second partial discharge diagnosis unit configured to make a secondary partial discharge diagnosis through pattern analysis of at least one of discharge magnitude function groups, discharge time difference function groups, composite function groups of discharge magnitude and discharge time difference, and discharge waveform frequency function groups, and a final diagnosis unit configured to diagnose a partial discharge of the HVDC cable on the basis of a result of the primary partial discharge diagnosis and a result of the secondary partial discharge diagnosis.

The first partial discharge diagnosis unit may make the primary partial discharge diagnosis through pattern analysis of at least one of a discharge magnitude trend, a 10-minute cumulative discharge amount, a 1-minute cumulative discharge amount, class-specific discharge numbers, a discharge time difference, a relationship between the discharge time difference and a discharge magnitude, an average discharge time difference, a discharge magnitude difference, maximum/average discharge magnitudes, and frequency band-specific discharge numbers.

The first partial discharge diagnosis unit may diagnose an abnormal state on the basis of the discharge magnitude and a discharge frequency in analysis of the discharge magnitude trend, diagnose an abnormal state on the basis of a cumulative discharge number in analysis of the 1-minute and 10-minute cumulative discharge amounts, diagnose an abnormal state on the basis of a discharge class and the class-specific discharge numbers in analysis of the class-specific discharge numbers, diagnose an abnormal state on the basis of a time difference (x axis) between a time point of partial discharge occurrence and an immediately previous discharge and a time difference (y axis) between the time point of the partial discharge occurrence and an immediately subsequent discharge in analysis of the discharge time difference, diagnose an abnormal state on the basis of a time difference (x axis) between a time point of partial discharge occurrence and an immediately previous or subsequent discharge and a discharge magnitude (y axis) in analysis of the relationship between the discharge time difference and the discharge magnitude, diagnose an abnormal state on the basis of the average discharge time difference in analysis of the average discharge time difference, diagnose an abnormal state on the basis of a dispersed distribution at a midpoint of discharge magnitudes before and after a discharge in analysis of the discharge magnitude difference, diagnose an abnormal state on the basis of maximum and average discharge magnitudes in analysis of the maximum and average discharge magnitudes, and diagnose an abnormal state on the basis of whether a frequency band rises and the number of discharges in a risen frequency band in analysis of the frequency band-specific discharge numbers.

The second partial discharge diagnosis unit may generate the discharge magnitude function groups by grouping individual partial discharge diagnosis results based on a discharge trend, a 10-minute cumulative discharge amount, a 1-minute cumulative discharge amount, and class-specific discharge numbers, make a secondary partial discharge diagnosis using the discharge magnitude function groups, give a preset impact factor to a diagnosis result of each of the discharge trend, the 10-minute cumulative discharge amount, the 1-minute cumulative discharge amount, and the class-specific discharge numbers, and diagnose whether the HVDC cable is abnormal on the basis of each diagnosis result to which the impact factor is given.

The second partial discharge diagnosis unit may generate the discharge time difference function groups by grouping individual partial discharge diagnosis results based on a discharge time difference, a relationship between the discharge time difference and a discharge magnitude, and an average discharge time difference, make a secondary partial discharge diagnosis using the discharge time difference function groups, give a preset impact factor to a diagnosis result of each of the discharge time difference, the relationship between the discharge time difference and the discharge magnitude, and the average discharge time difference, and diagnose whether the HVDC cable is abnormal on the basis of each diagnosis result to which the impact factor is given.

The second partial discharge diagnosis unit may generate the composite function groups of discharge magnitude and discharge time difference by grouping individual partial discharge diagnosis results based on a discharge magnitude difference and maximum/average discharge magnitudes, make a secondary partial discharge diagnosis using the composite function groups of discharge magnitude and discharge time difference, give a preset impact factor to a diagnosis result of each of the discharge magnitude difference and the maximum/average discharge magnitudes, and diagnose whether the HVDC cable is abnormal on the basis of each diagnosis result to which the impact factor is given.

The second partial discharge diagnosis unit may generate the discharge waveform frequency function groups by grouping individual partial discharge diagnoses of frequency band-specific discharge numbers and make a secondary partial discharge diagnosis using the discharge waveform frequency function groups.

The HVDC cable partial discharge diagnosis system may further include an output unit configured to output at least one of a result of the primary partial discharge diagnosis, a result of the secondary partial discharge diagnosis, and a final diagnosis result.

The HVDC cable partial discharge diagnosis device may include at least one of a real-time partial discharge diagnosis device configured to make a diagnosis at all times and a portable partial discharge diagnosis device configured to make a diagnosis at a specific location during a specific time period.

The HVDC cable partial discharge diagnosis system may further include a master station configured to manage state information of the plurality of HVDC cable partial discharge measurement devices and a partial discharge signal detected by each HVDC cable partial discharge measurement device and store a partial discharge diagnosis result of the HVDC cable diagnosed by the HVDC cable partial discharge diagnosis device.

Another aspect of the present invention provides an HVDC cable partial discharge diagnosis method including acquiring, by HVDC cable partial discharge measurement devices, measurement result information from sensors installed on an HVDC cable and detecting a partial discharge signal from the measurement result information, and receiving, by an HVDC cable partial discharge diagnosis device, the partial discharge signal from the HVDC cable partial discharge measurement devices and diagnosing whether there is a partial discharge in the HVDC cable through pattern analysis of the partial discharge signal.

The diagnosing of whether there is a partial discharge in the HVDC cable may include making, by the HVDC cable partial discharge diagnosis device, a primary partial discharge diagnosis through pattern analysis of individual functions of predefined items, making, by the HVDC cable partial discharge diagnosis device, a secondary partial discharge diagnosis through pattern analysis of at least one of discharge magnitude function groups, discharge time difference function groups, composite function groups of discharge magnitude and discharge time difference, and discharge waveform frequency function groups, and diagnosing, by the HVDC cable partial discharge diagnosis device, a partial discharge of the HVDC cable on the basis of a result of the primary partial discharge diagnosis and a result of the secondary partial discharge diagnosis.

The making of the primary partial discharge diagnosis may include making, by the HVDC cable partial discharge diagnosis device, the primary partial discharge diagnosis through pattern analysis of at least one of a discharge magnitude trend, a 10-minute cumulative discharge amount, a 1-minute cumulative discharge amount, class-specific discharge numbers, a discharge time difference, a relationship between the discharge time difference and a discharge magnitude, an average discharge time difference, a discharge magnitude difference, maximum/average discharge magnitudes, and frequency band-specific discharge numbers.

The making of the primary partial discharge diagnosis may include diagnosing, by the HVDC cable partial discharge diagnosis device, an abnormal state on the basis of the discharge magnitude and a discharge frequency in analysis of the discharge magnitude trend, diagnosing an abnormal state on the basis of a cumulative discharge number in analysis of the 1-minute and 10-minute cumulative discharge amounts, diagnosing an abnormal state on the basis of a discharge class and the class-specific discharge numbers in analysis of the class-specific discharge numbers, diagnosing an abnormal state on the basis of a time difference (x axis) between a time point of partial discharge occurrence and an immediately previous discharge and a time difference (y axis) between the time point of the partial discharge occurrence and an immediately subsequent discharge in analysis of the discharge time difference, diagnosing an abnormal state on the basis of the time difference (x axis) between a time point of partial discharge occurrence and an immediately previous or subsequent discharge and a discharge magnitude (y axis) in analysis of the relationship between the discharge time difference and the discharge magnitude, diagnosing an abnormal state on the basis of the average discharge time difference in analysis of the average discharge time difference, diagnosing an abnormal state on the basis of a dispersed distribution at a midpoint of discharge magnitudes before and after a discharge in analysis of the discharge magnitude difference, diagnosing an abnormal state on the basis of maximum and average discharge magnitudes in analysis of the maximum and average discharge magnitudes, and diagnosing an abnormal state on the basis of whether a frequency band rises and the number of discharges in a risen frequency band in analysis of the frequency band-specific discharge numbers.

The making of the second partial discharge diagnosis may include generating, by the HVDC cable partial discharge diagnosis device, discharge magnitude function groups by grouping individual partial discharge diagnosis results based on a discharge trend, a 10-minute cumulative discharge amount, a 1-minute cumulative discharge amount, and class-specific discharge numbers, making a secondary partial discharge diagnosis using the discharge magnitude function group, giving a preset impact factor to a diagnosis result of each of the discharge trend, the 10-minute cumulative discharge amount, the 1-minute cumulative discharge amount, and the class-specific discharge numbers, and diagnosing whether the HVDC cable is abnormal on the basis of each diagnosis result to which the impact factor is given.

The making of the second partial discharge diagnosis may include generating, by the HVDC cable partial discharge diagnosis device, discharge time difference function groups by grouping individual partial discharge diagnosis results based on a discharge time difference, a relationship between the discharge time difference and a discharge magnitude, and an average discharge time difference, making a secondary partial discharge diagnosis using the discharge time difference function groups, giving a preset impact factor to a diagnosis result of each of the discharge time difference, the relationship between the discharge time difference and the discharge magnitude, and the average discharge time difference, and diagnosing whether the HVDC cable is abnormal on the basis of each diagnosis result to which the impact factor is given.

The making of the second partial discharge diagnosis may include generating, by the HVDC cable partial discharge diagnosis device, composite function groups of discharge magnitude and discharge time difference by grouping individual partial discharge diagnosis results based on a discharge magnitude difference and maximum/average discharge magnitudes, making a secondary partial discharge diagnosis using the composite function groups of discharge magnitude and discharge time difference, giving a preset impact factor to a diagnosis result of each of the discharge magnitude difference and the maximum/average discharge magnitudes, and diagnosing whether the HVDC cable is abnormal on the basis of each diagnosis result to which the impact factor is given.

The making of the second partial discharge diagnosis may include generating, by the HVDC cable partial discharge diagnosis device, the discharge waveform frequency function groups by grouping individual partial discharge diagnoses of frequency band-specific discharge numbers and making a secondary partial discharge diagnosis using the discharge waveform frequency function groups.

The HVDC cable partial discharge diagnosis method may further include outputting, by the HVDC cable partial discharge diagnosis device, a result of the primary partial discharge diagnosis, a result of the secondary partial discharge diagnosis, and a final diagnosis result.

Advantageous Effects

With a high-voltage direct current (HVDC) cable partial discharge diagnosis system and method according to an embodiment of the present invention, it is possible to diagnose a partial discharge of an HVDC cable by analyzing a pattern of an HVDC cable partial discharge signal analyzed through partial discharge measurement of the HVDC cable.

Effects of the present invention are not limited to that described above, and various effects can be included within a range evident to those of ordinary skill in the art from the following description.

MODES OF THE INVENTION

Figure 1:
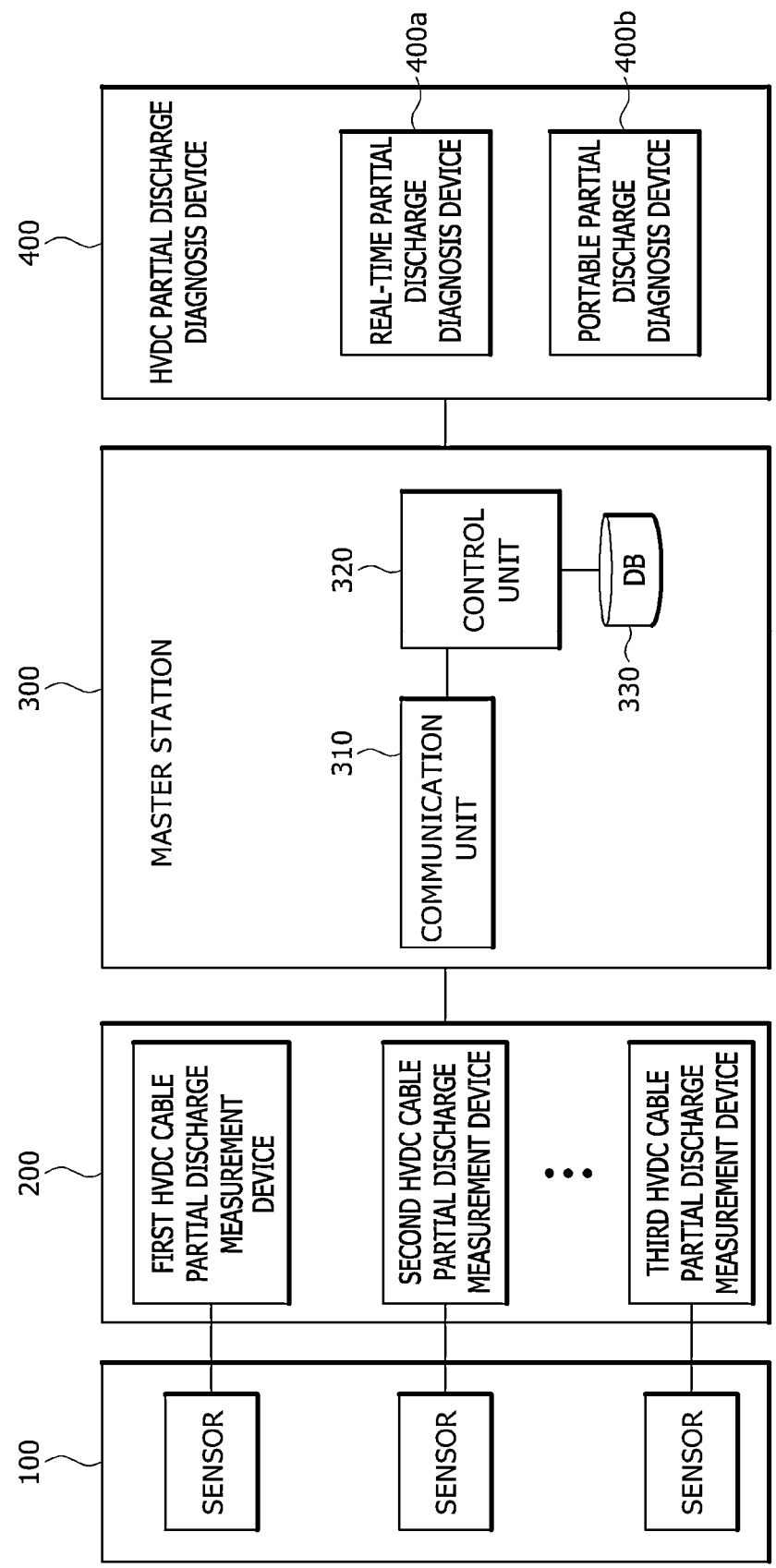
FIG. 1 is a schematic diagram of a high-voltage direct current (HVDC) cable partial discharge diagnosis system according to an embodiment of the present invention.

Hereinafter, a high-voltage direct current (HVDC) cable partial discharge diagnosis system and method according to an embodiment of the present invention will be described with reference to the accompanying drawings. In this process, the thicknesses of lines, the sizes of components, and the like shown in the drawings may be exaggerated for the purpose of clarity and convenience of description. Also, terms to be described below are defined in consideration of functions in the present invention, and the terms may vary depending on the intention of a user or operator or precedents. Therefore, the definitions of these terms should be made on the basis of the overall content of the specification.

Description of the specification can be implemented as, for example, a method or a process, a device, a software program, a data stream, or a signal. Even when only discussed in the context of a single form of implementation (e.g., discussed only as a method), discussed features may also be implemented in other forms (e.g., a program). An apparatus may be implemented as, for example, appropriate hardware, software, firmware, and the like. A method may be implemented in a device, such as a processor or the like, which generally refers to a processing device including a computer, a microprocessor, an integrated circuit, a programmable logic device, or the like. Processors also include communication devices, such as a computer, a cellular phone, a portable/personal digital assistant (PDA), and other devices, that facilitate communication of information between end users.

Figure 2:
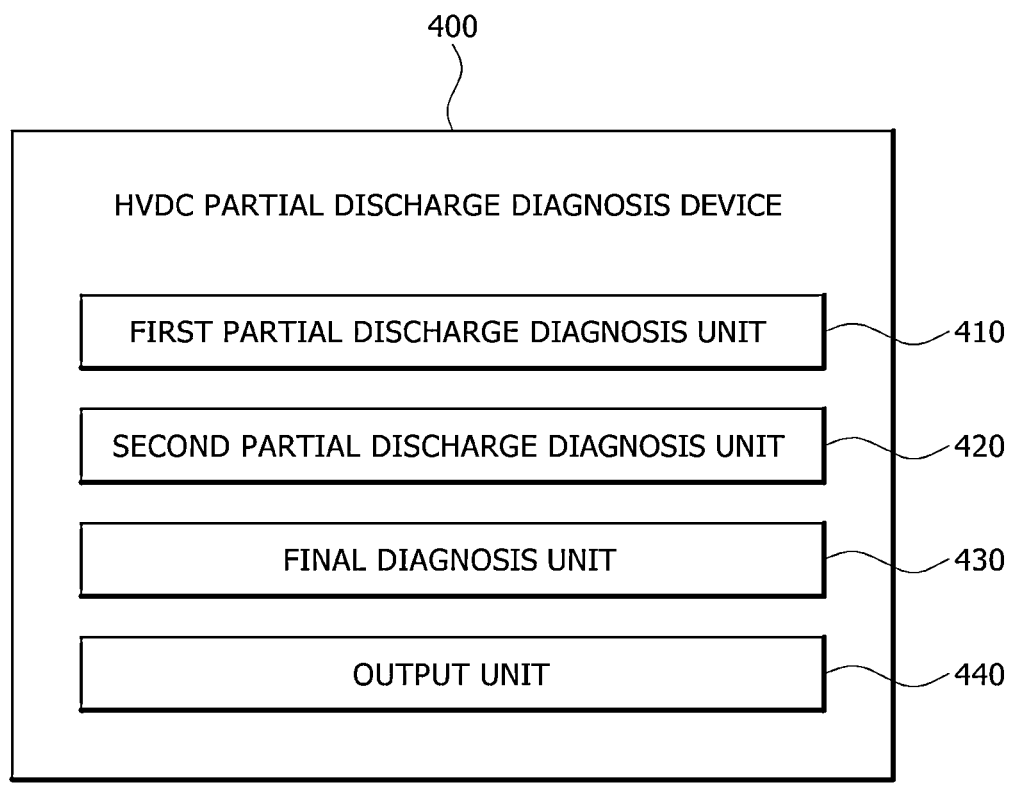
FIG. 2 is a schematic block diagram of an HVDC cable partial discharge diagnosis device shown in FIG. 1.
Figure 3A:
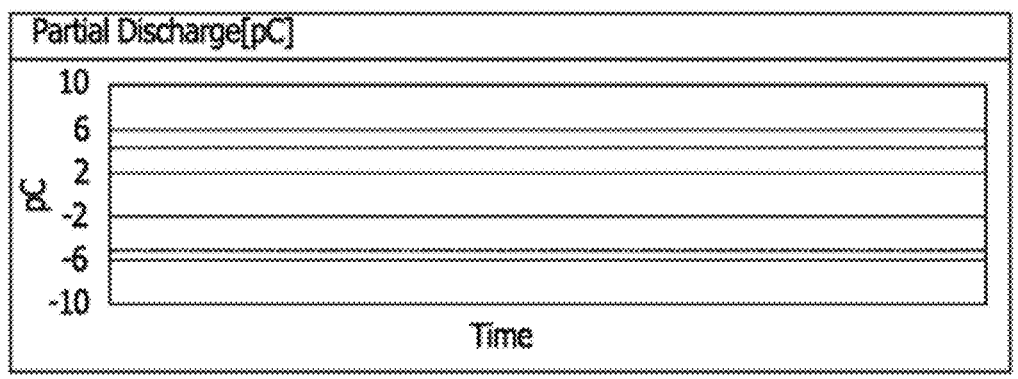
FIGS. 3A and 3B are a diagrams illustrating a diagnosis based on individual pattern analysis of a discharge magnitude trend according to an embodiment of the present invention.
Figure 3B:
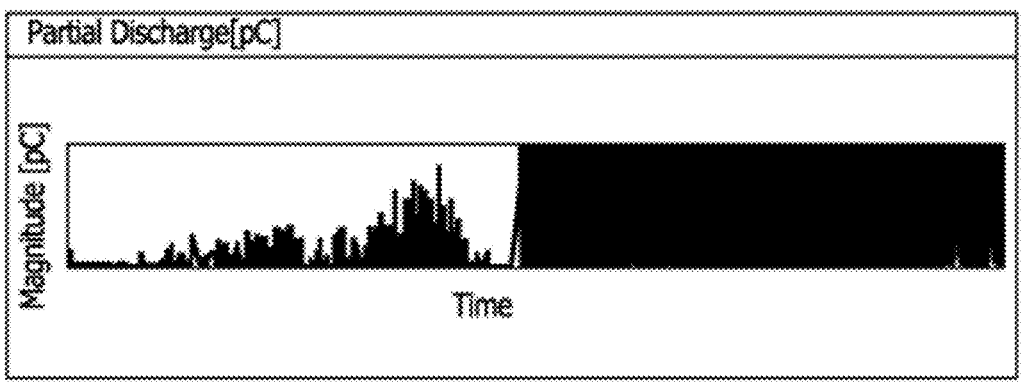
Figure 4A:
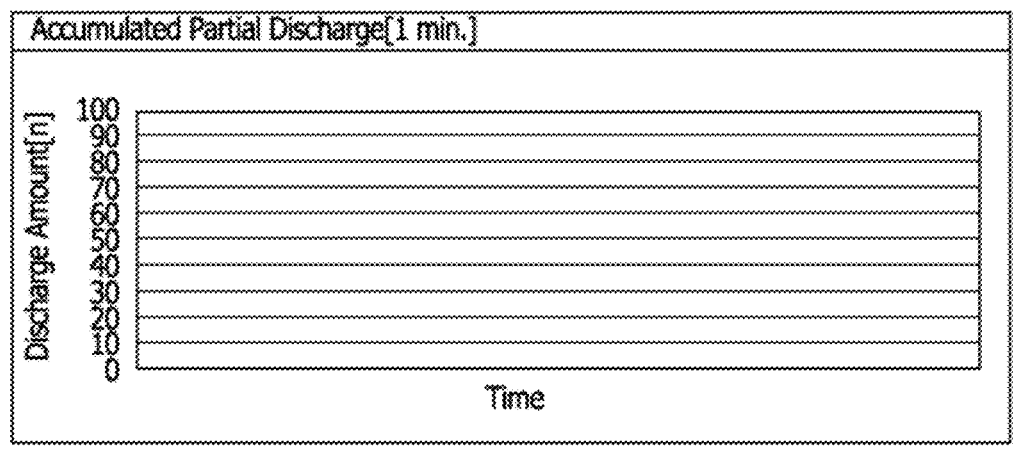
FIGS. 4A and 4B are diagrams illustrating a diagnosis based on individual pattern analysis of a 1-minute cumulative discharge amount according to an embodiment of the present invention.
Figure 4B:
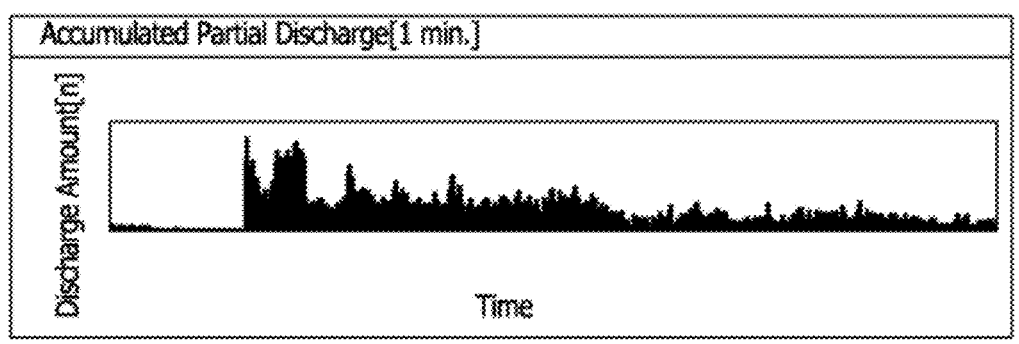
Figure 5A:
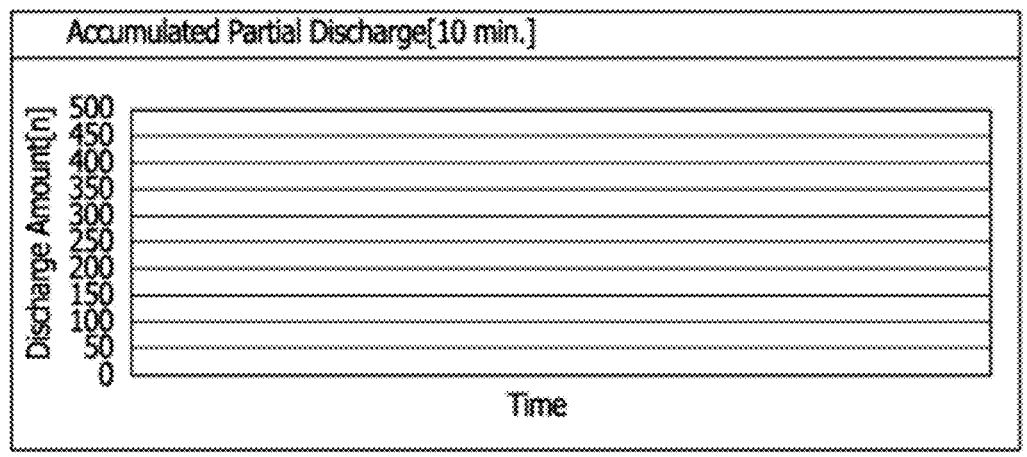
FIGS. 5A and 5B are diagrams illustrating a diagnosis based on individual pattern analysis of a 10-minute cumulative discharge amount according to an embodiment of the present invention.
Figure 5B:
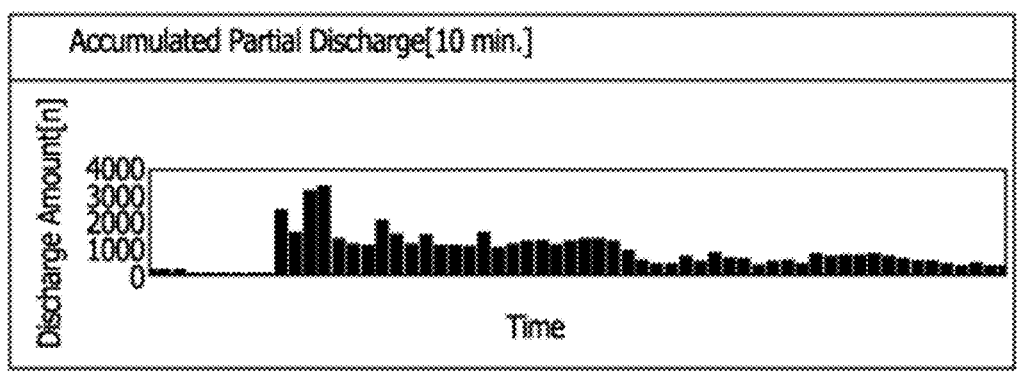
Figure 6A:
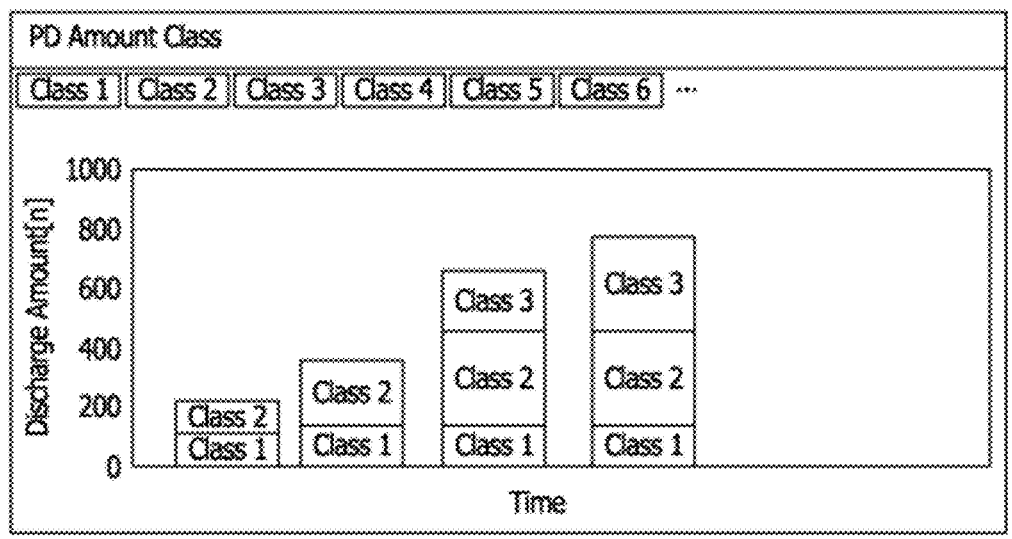
FIGS. 6A and 6B are diagrams illustrating a diagnosis based on individual pattern analysis of class-specific discharge numbers according to an embodiment of the present invention.
Figure 6B:
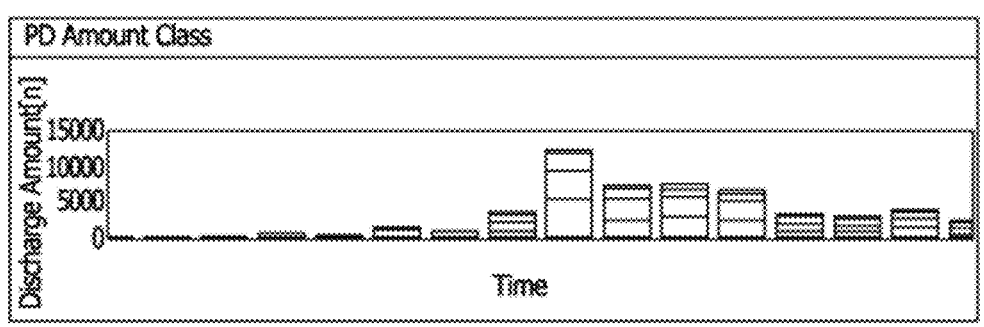
Figure 7A:
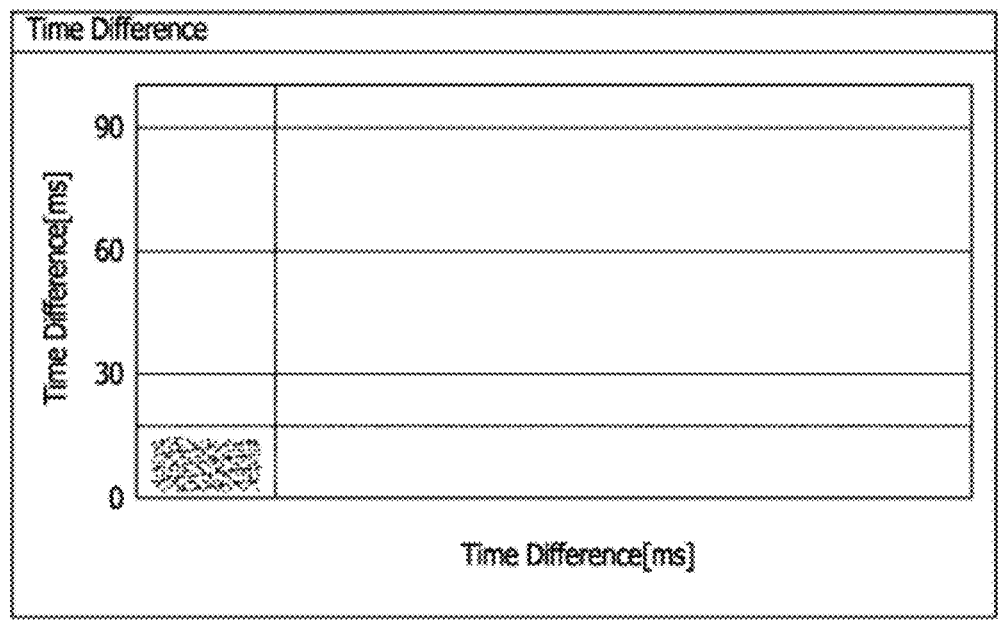
FIGS. 7A and 7B are diagrams illustrating a diagnosis based on individual pattern analysis of a discharge time difference according to an embodiment of the present invention.
Figure 7B:
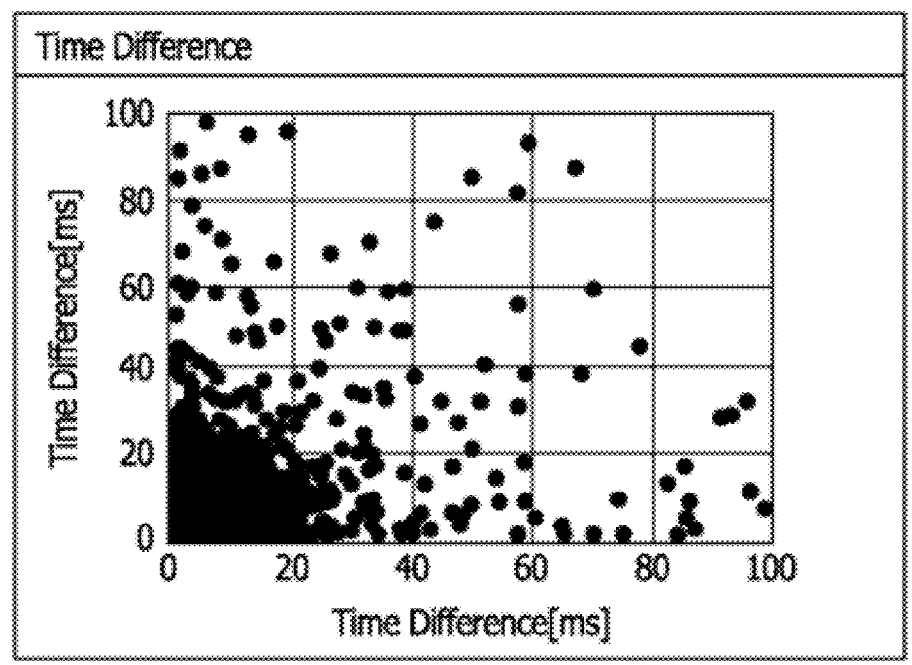
Figure 8A:
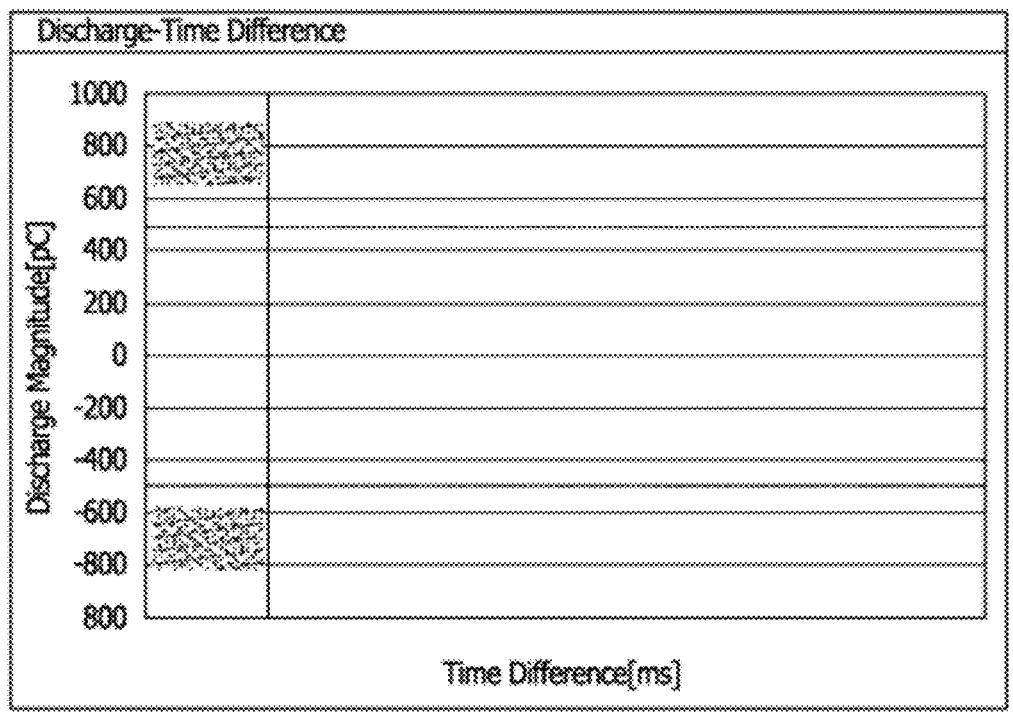
FIGS. 8A and 8B are diagrams illustrating a diagnosis based on individual pattern analysis of the relationship between a discharge time difference and a discharge magnitude according to an embodiment of the present invention.
Figure 8B:
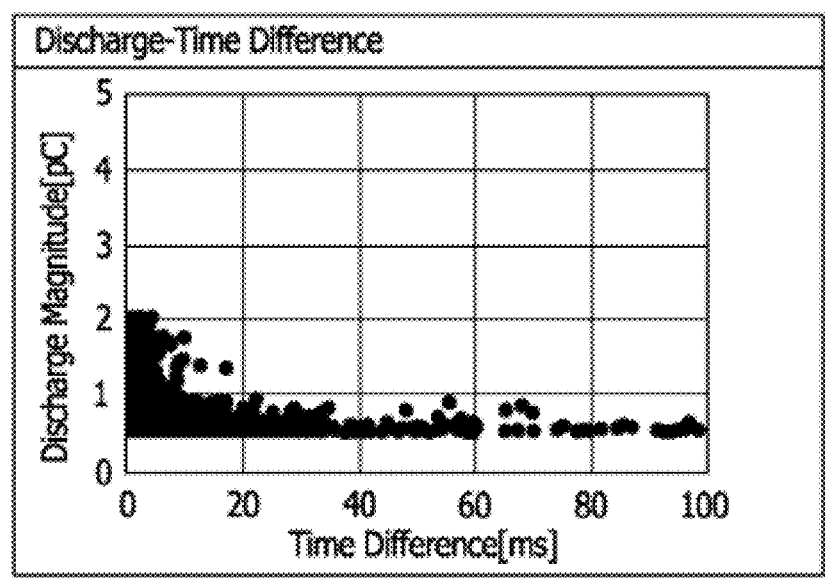
Figure 9A:
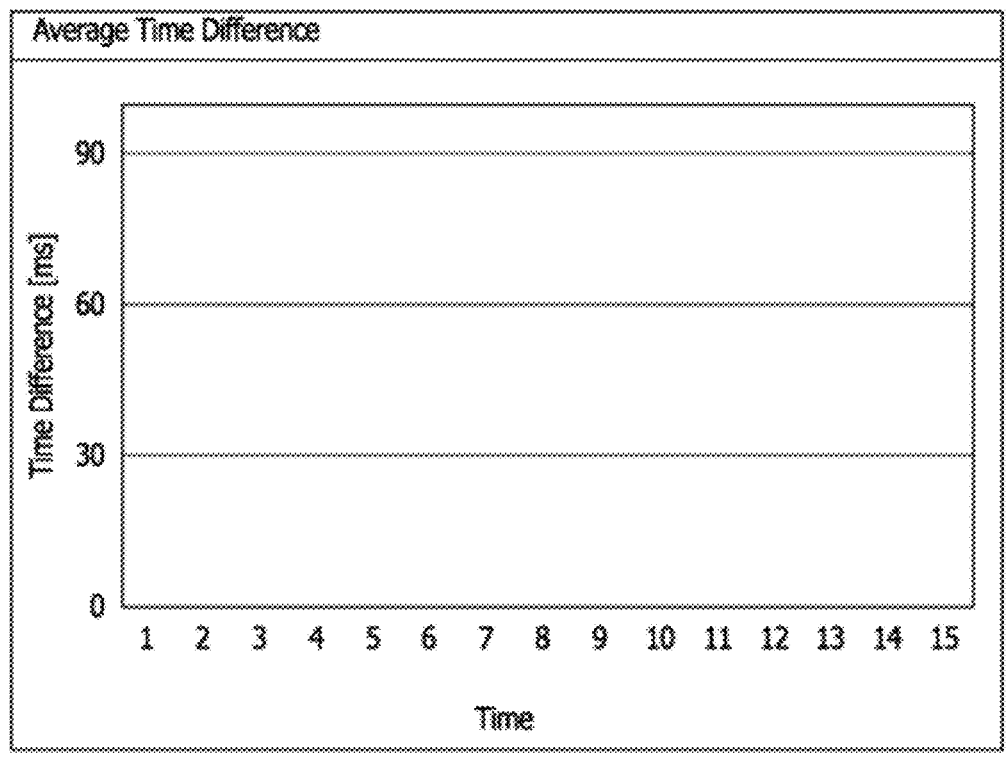
FIGS. 9A and 9B are diagrams illustrating a diagnosis based on individual pattern analysis of an average discharge time difference according to an embodiment of the present invention.
Figure 9B:
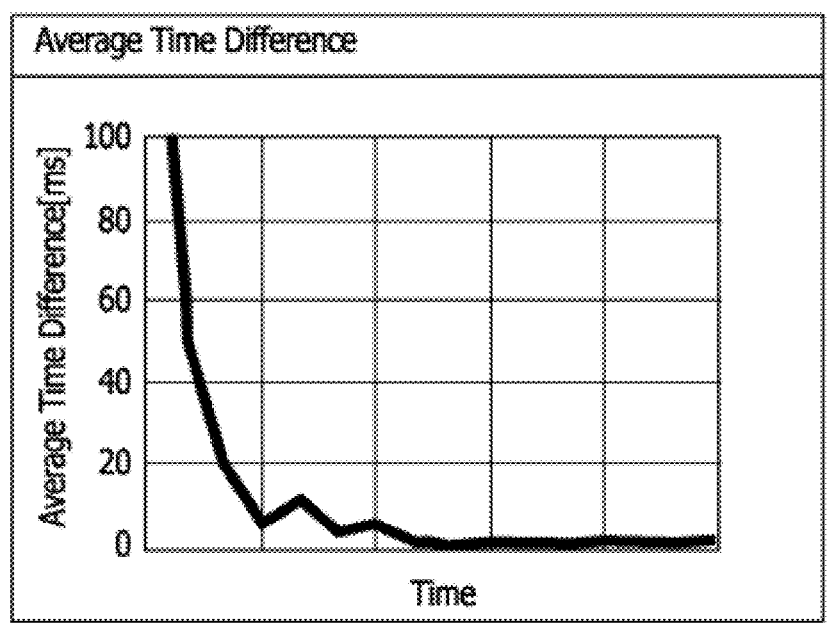
Figure 10A:
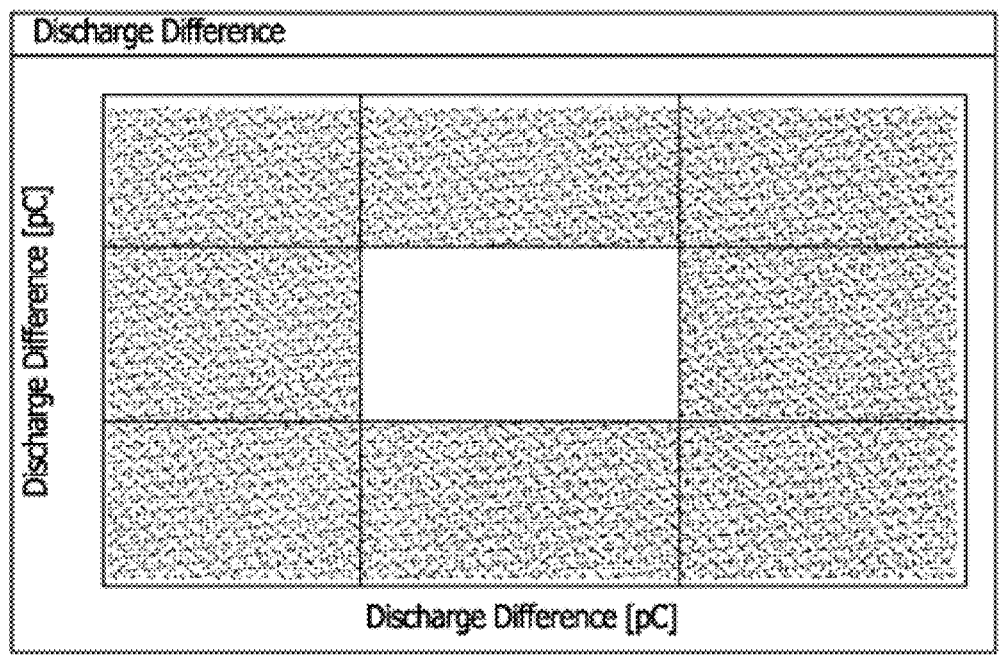
FIGS. 10A and 10B are diagrams illustrating a diagnosis based on individual pattern analysis of a discharge magnitude difference according to an embodiment of the present invention.
Figure 10B:
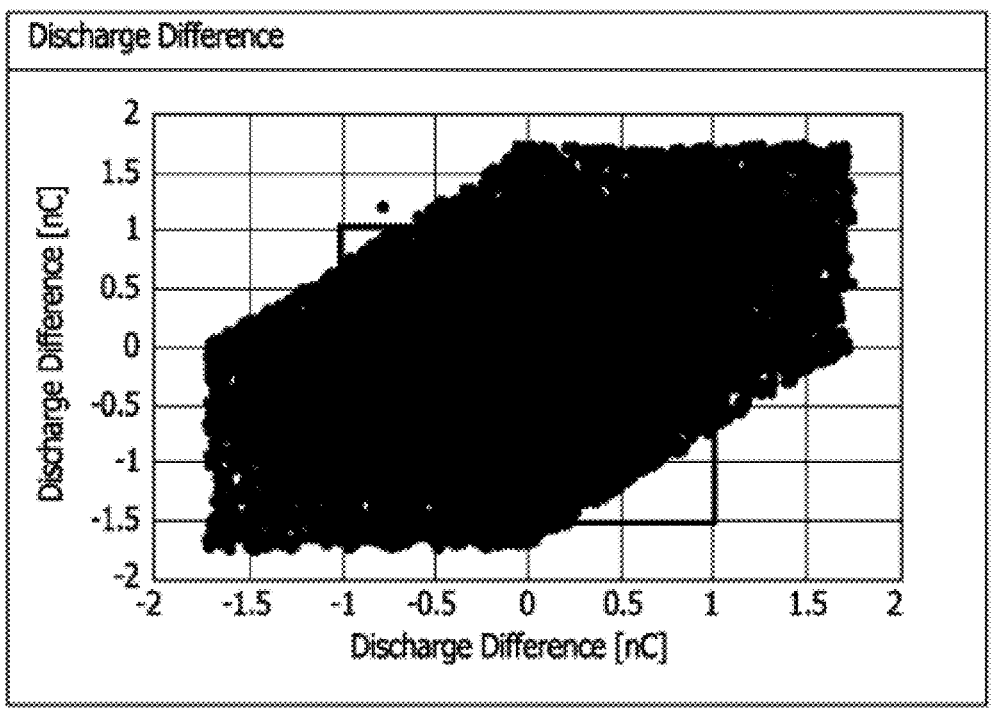
Figure 11A:
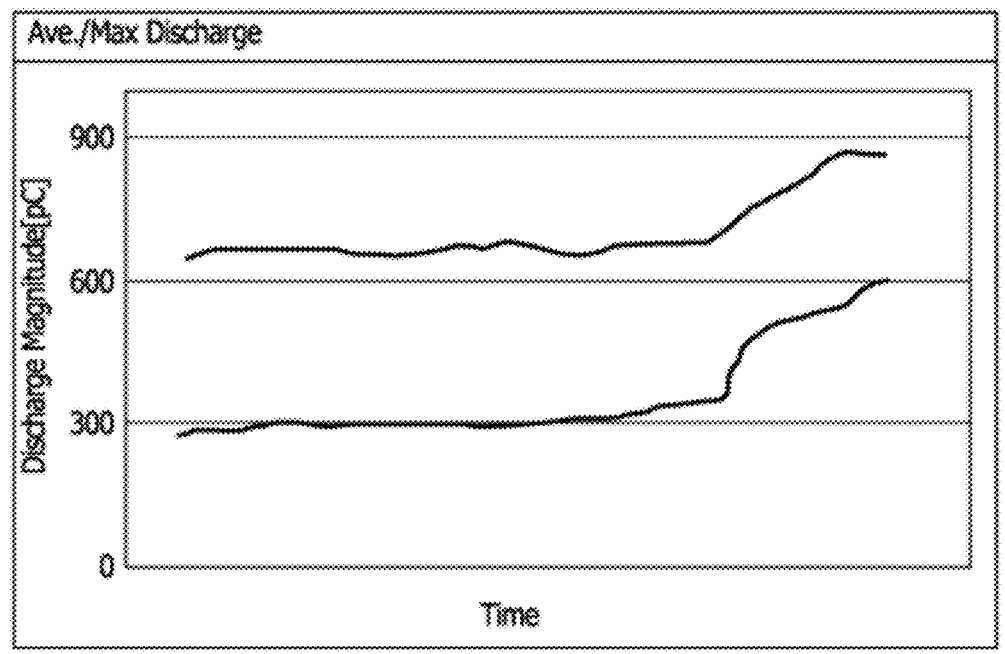
FIGS. 11A and 11B are diagrams illustrating a diagnosis based on individual pattern analysis of maximum/average discharge magnitudes according to an embodiment of the present invention.
Figure 11B:
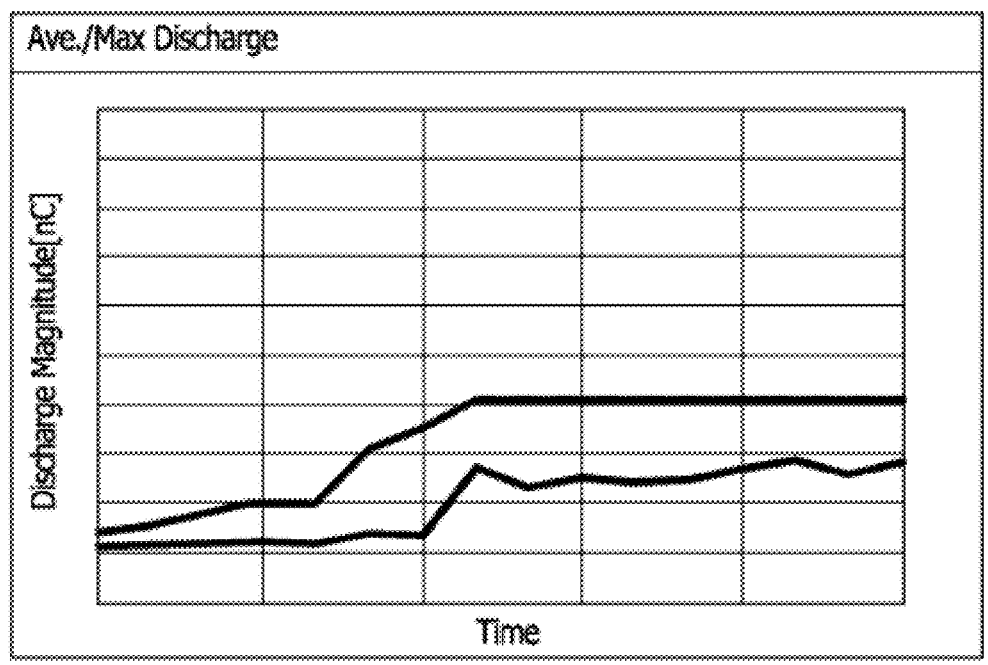
Figure 12A:
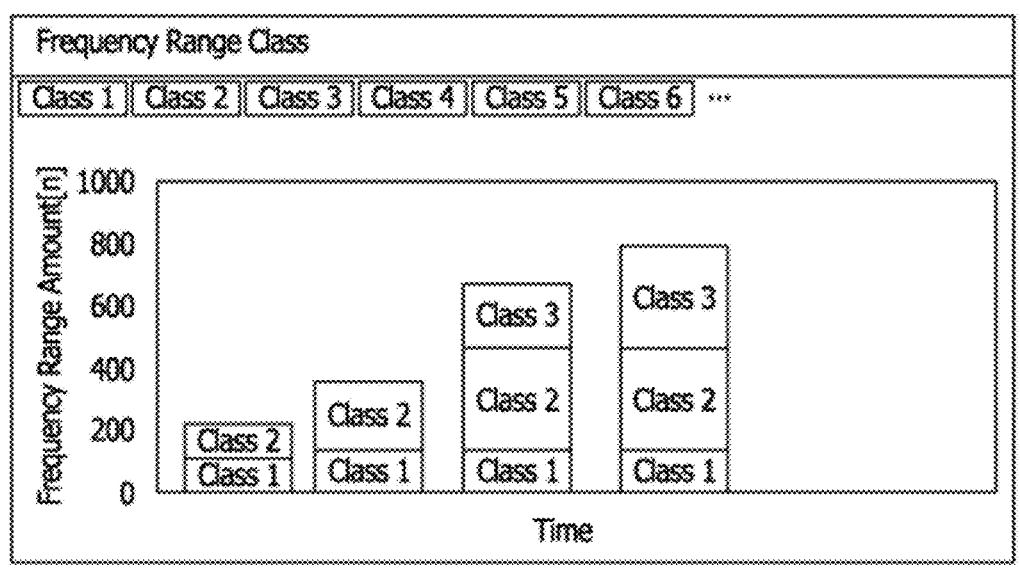
FIGS. 12A and 12B are diagrams illustrating a diagnosis based on individual pattern analysis of the number of discharges in each frequency band of a discharge waveform according to an embodiment of the present invention.
Figure 12B:
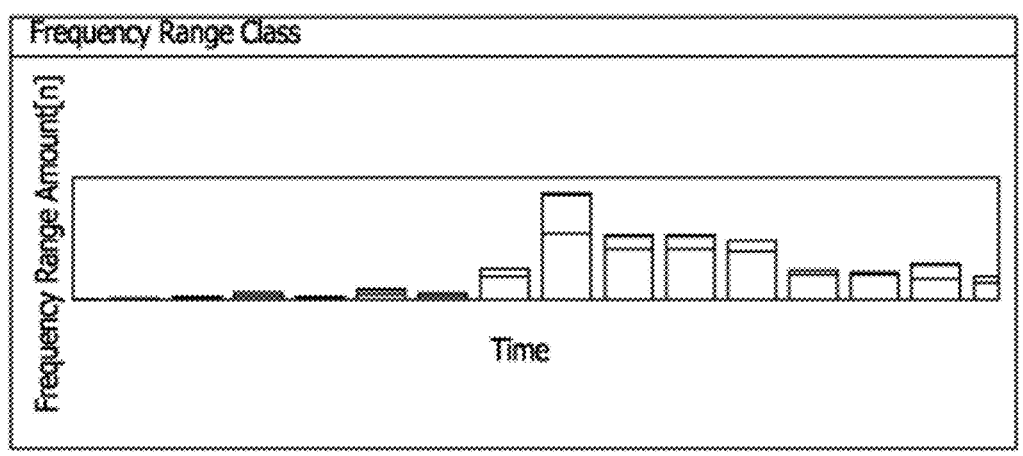
Figure 13A:
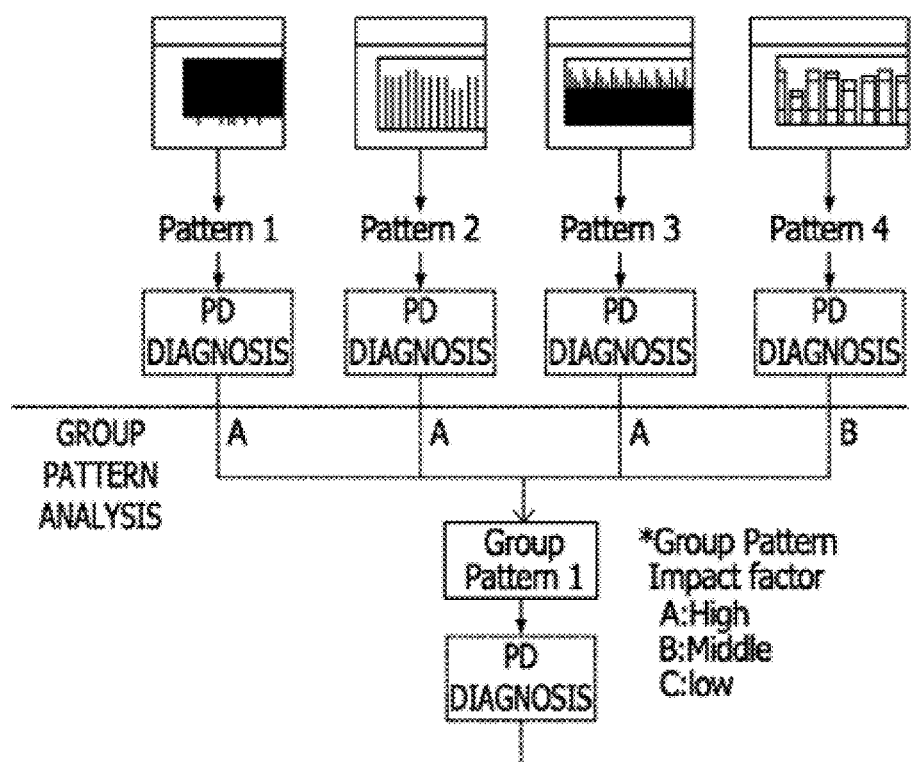
FIGS. 13A to 13C are diagrams illustrating a diagnosis based on individual pattern analysis of a discharge magnitude function group (group 1) according to an embodiment of the present invention.
Figure 13B:
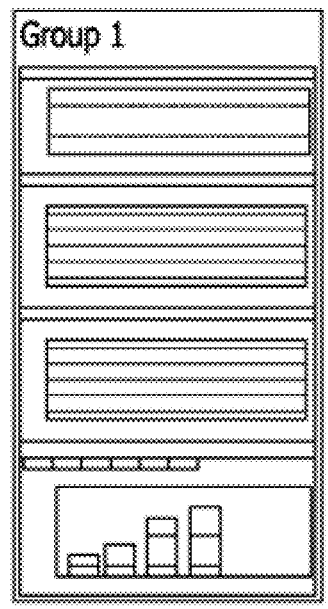
Figure 13C:
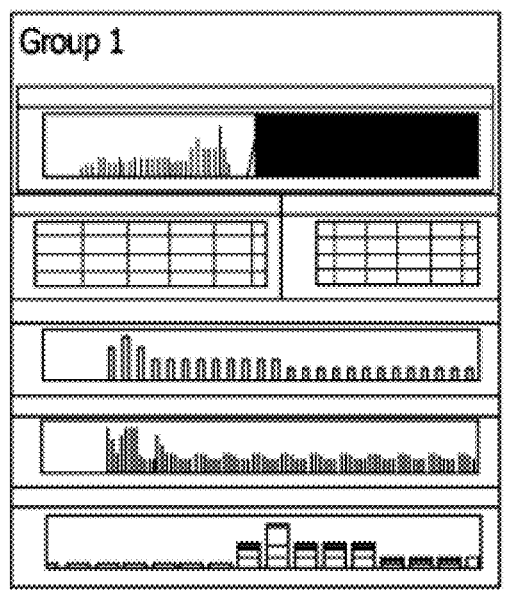
Figure 14A:
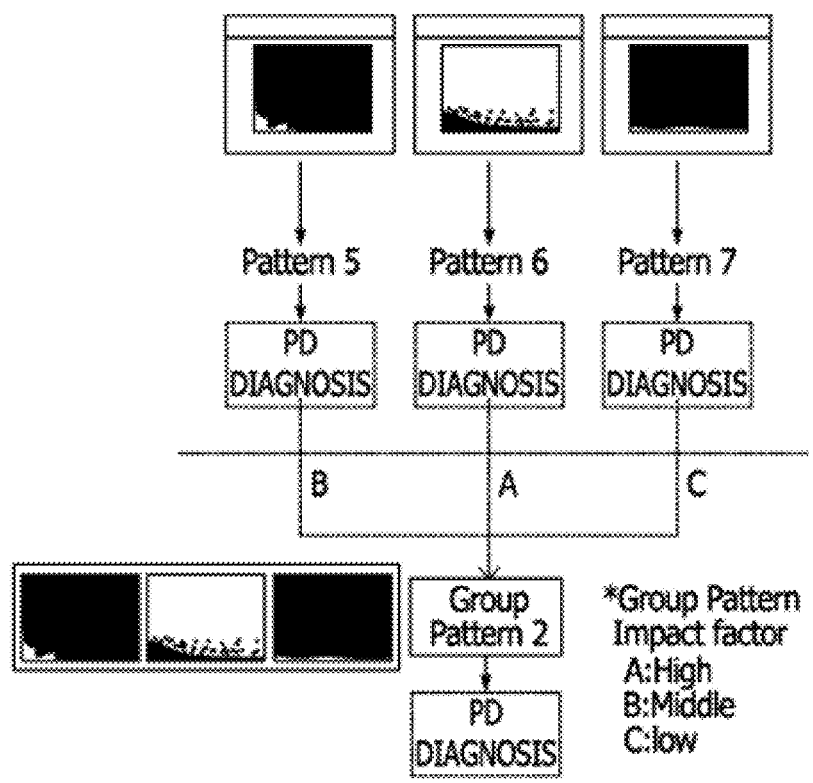
FIGS. 14A to 14C are diagrams illustrating a diagnosis based on individual pattern analysis of a discharge magnitude function group (group 2) according to an embodiment of the present invention.
Figure 14B:
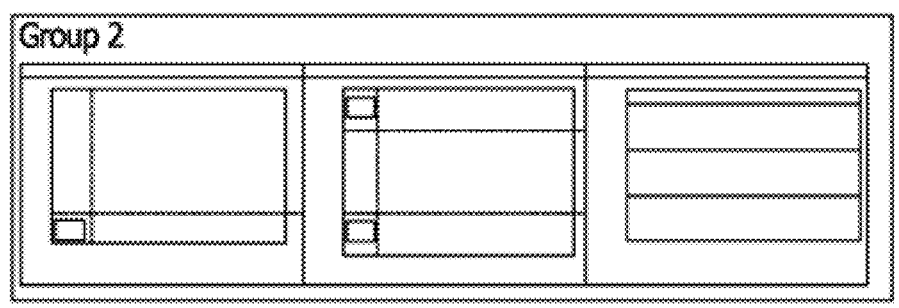
Figure 14C:
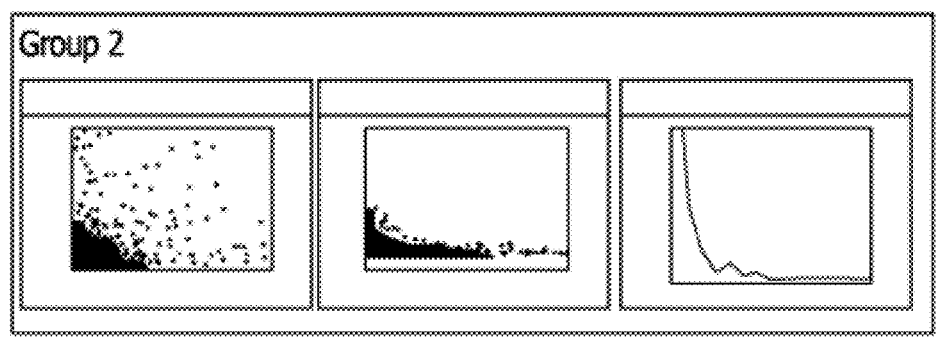
Figure 15A:
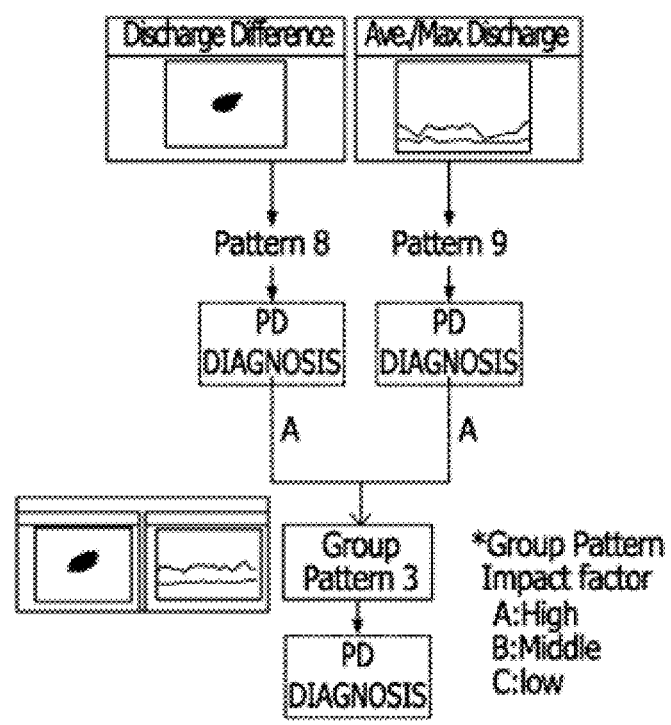
FIGS. 15A to 15C are diagrams illustrating a diagnosis based on individual pattern analysis of a discharge magnitude function group (group 3) according to an embodiment of the present invention.
Figure 15B:
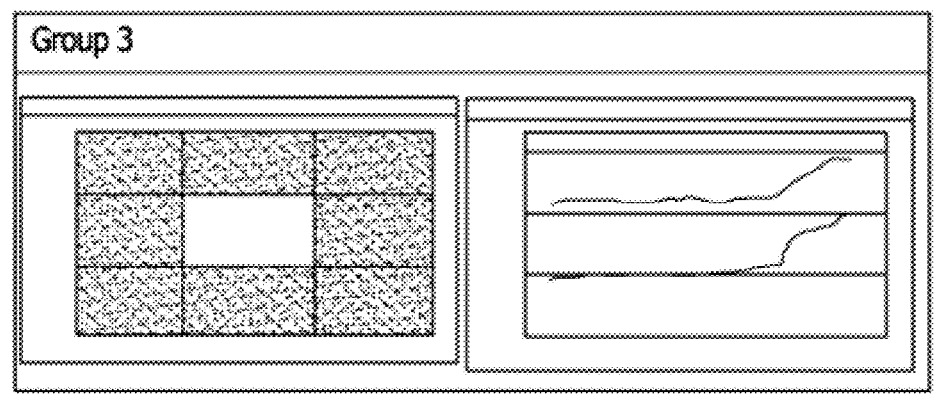
Figure 15C:
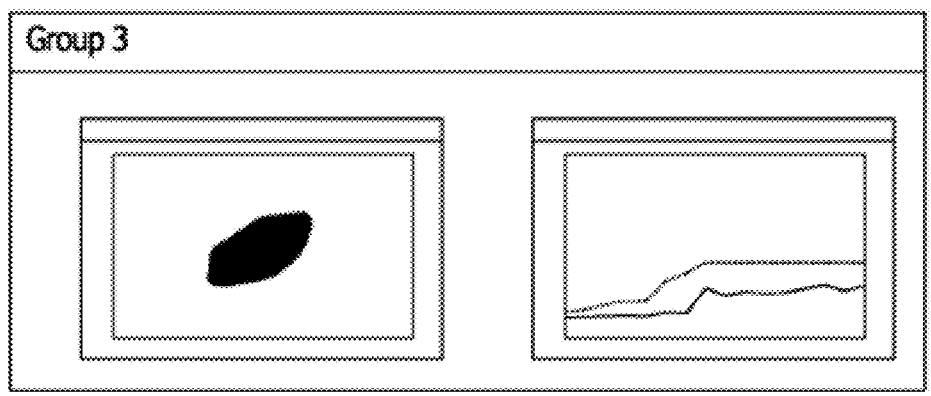
Figure 16:
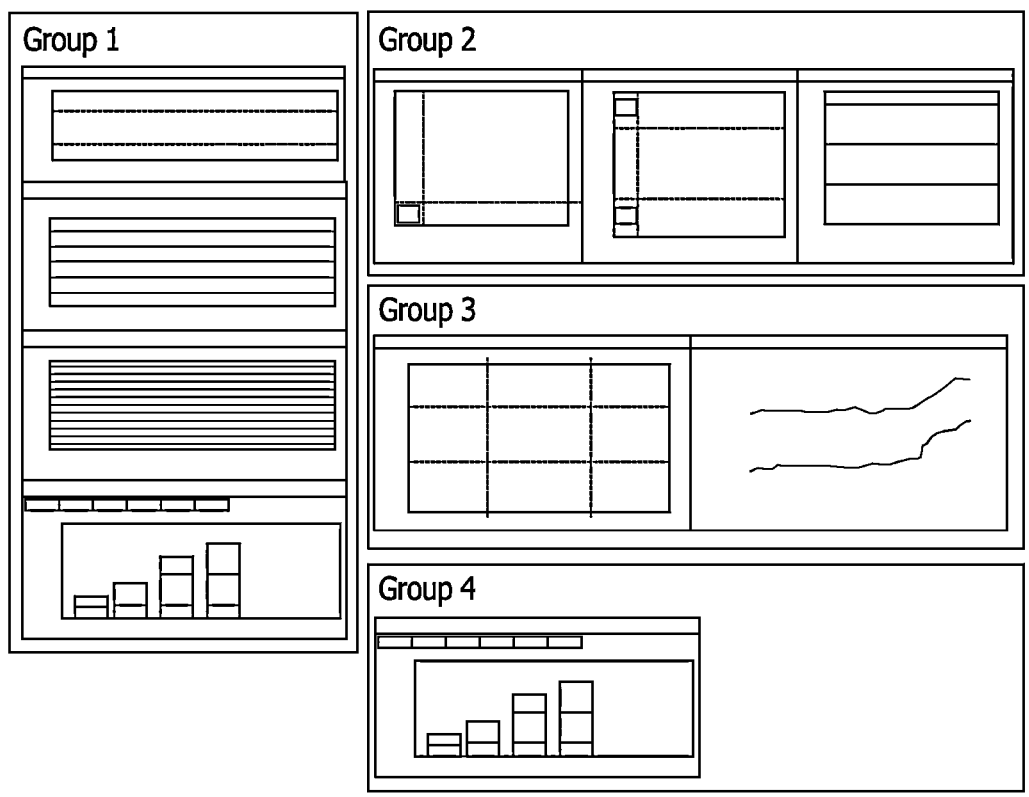
FIG. 16 is a diagram illustrating a screen in which a secondary partial discharge diagnosis is made through pattern analysis of an HVDC cable partial discharge group according to an embodiment of the present invention.

FIG. 1 is a schematic diagram of an HVDC cable partial discharge diagnosis system according to an embodiment of the present invention, FIG. 2 is a schematic block diagram of an HVDC cable partial discharge diagnosis device shown in FIG. 1, FIGS. 3A and 3B are diagrams illustrating a diagnosis based on individual pattern analysis of a discharge magnitude trend according to an embodiment of the present invention, FIGS. 4A and 4B are diagrams illustrating a diagnosis based on individual pattern analysis of a 1-minute cumulative discharge amount according to an embodiment of the present invention, FIGS. 5A and 5B are diagrams illustrating a diagnosis based on individual pattern analysis of a 10-minute cumulative discharge amount according to an embodiment of the present invention, FIGS. 6A and 6B are diagrams illustrating a diagnosis based on individual pattern analysis of class-specific discharge numbers according to an embodiment of the present invention, FIGS. 7A and 7B are diagrams illustrating a diagnosis based on individual pattern analysis of a discharge time difference according to an embodiment of the present invention, FIGS. 8A and 8B are diagrams illustrating a diagnosis based on individual pattern analysis of the relationship between a discharge time difference and a discharge magnitude according to an embodiment of the present invention, FIGS. 9A and 9B are diagrams illustrating a diagnosis based on individual pattern analysis of an average discharge time difference according to an embodiment of the present invention, FIGS. 10A and 10B are diagrams illustrating a diagnosis based on individual pattern analysis of a discharge magnitude difference according to an embodiment of the present invention, FIGS. 11A and 11B are diagrams illustrating a diagnosis based on individual pattern analysis of maximum/average discharge magnitudes according to an embodiment of the present invention, FIGS. 12A and 12B are diagrams illustrating a diagnosis based on individual pattern analysis of the number of discharges in each frequency band of a discharge waveform according to an embodiment of the present invention, FIGS. 13A to 13C are diagrams illustrating a diagnosis based on individual pattern analysis of a discharge magnitude function group (group 1) according to an embodiment of the present invention, FIGS. 14A to 14C are diagrams illustrating a diagnosis based on individual pattern analysis of a discharge magnitude function group (group 2) according to an embodiment of the present invention, FIGS. 15A to 15C are diagrams illustrating a diagnosis based on individual pattern analysis of a discharge magnitude function group (group 3) according to an embodiment of the present invention, and FIG. 16 is a diagram illustrating a screen in which a secondary partial discharge diagnosis is made through pattern analysis of an HVDC cable partial discharge group according to an embodiment of the present invention.

Referring to FIG. 1, the HVDC cable partial discharge diagnosis system according to the embodiment of the present invention includes sensors 100 installed on an HVDC cable, a plurality of HVDC cable partial discharge measurement devices (hereinafter, "partial discharge measurement devices") 200, a master station 300, and an HVDC cable partial discharge diagnosis device (hereinafter, "partial discharge diagnosis device") 400.

The partial discharge measurement devices 200 may acquire measurement result information from the sensors 100 and detect a partial discharge signal from the measurement result information.

Each partial discharge measurement device 200 interoperates with a network management system (NMS) (not shown), and partial discharge signals and the partial discharge measurement devices 200 may be controlled by the master station 300.

The partial discharge measurement devices 200 are connected in series, and each partial discharge measurement device 200 may be finally connected to the master station 300.

The master station 300 may manage state information of the plurality of partial discharge measurement devices 200 and a partial discharge signal detected by each partial discharge measurement device 200.

Also, the master station 300 may store partial discharge diagnosis results of an HVDC cable diagnosed by the partial discharge diagnosis device 400.

The master station 300 may include a communication unit 310, a control unit 320, and a database 330.

The communication unit 310 is a component for communication with the partial discharge diagnosis device 400 and the partial discharge measurement devices 200 and may transmit and receive various types of information such as the state information and the partial discharge signals of the partial discharge measurement devices 200, a partial discharge diagnosis result of the HVDC cable, and the like. Here, the communication unit 310 may be implemented in various forms such as a short-distance communication module, a wireless communication module, a mobile communication module, a wired communication module, and the like.

The control unit 320 may store various types of information, such as the state information and the partial discharge signals of the partial discharge measurement devices 200 received through the communication unit 310, in the database 330.

As a component for controlling operations of various constituent units of the master station 300, the control unit 320 may include at least one computation device. Here, the computation device may be a general-use central processing unit (CPU), a programmable device element (a complex programmable logic device (CPLD) or a field programmable gate array (FPGA)) implemented to be suitable for a specific purpose, an application specific integrated circuit (ASIC), a microcontroller chip, a virtual machine, or the like.

The partial discharge diagnosis device 400 may receive the partial discharge signals from the partial discharge measurement devices 200 and diagnose whether there is a partial discharge in the HVDC cable through pattern analysis of the partial discharge signals. Here, the partial discharge diagnosis device 400 may make a primary partial discharge diagnosis through pattern analysis of individual functions of predefined items and make a secondary partial discharge diagnosis through group pattern analysis of results of the primary partial discharge diagnosis.

The partial discharge diagnosis device 400 may include at least one of a real-time partial discharge diagnosis device 400 for making a diagnosis at all times and a portable partial discharge diagnosis device 400 for making a diagnosis at a specific location during a specific time period.

The partial discharge diagnosis device 400 may include a first partial discharge diagnosis unit 410, a second partial discharge diagnosis unit 420, a final diagnosis unit 430, and an output unit 440.

The first partial discharge diagnosis unit 410 may make a primary partial discharge diagnosis through pattern analysis of each individual function of the predefined items.

The first partial discharge diagnosis unit 410 may make a primary partial discharge diagnosis through pattern analysis of at least one of a discharge magnitude trend, a 10-minute cumulative discharge amount, a 1-minute cumulative discharge amount, class-specific discharge numbers, a discharge time difference, the difference between the discharge time difference and a discharge magnitude, an average discharge time difference, a discharge magnitude difference, maximum/average discharge magnitudes, and frequency band-specific discharge numbers. Here, the first partial discharge diagnosis unit 410 may diagnose an abnormal state on the basis of the discharge magnitude and a discharge frequency in the analysis of the discharge magnitude trend, diagnose an abnormal state on the basis of a cumulative discharge number in the analysis of the 1-minute and 10-minute cumulative discharge amounts, diagnose an abnormal state on the basis of a discharge class and the class-specific discharge numbers in the analysis of the class-specific discharge numbers, diagnose an abnormal state on the basis of a time difference (x axis) between a time point of partial discharge occurrence and an immediately previous discharge and a time difference (y axis) between the partial discharge occurrence and an immediately subsequent discharge in the analysis of the discharge time difference, diagnose an abnormal state on the basis of the time difference (x axis) between a time point of partial discharge occurrence and an immediately previous or subsequent discharge and a discharge magnitude (y axis) in the analysis of the relationship between the discharge time difference and the discharge magnitude, diagnose an abnormal state on the basis of the average discharge time difference in the analysis of the average discharge time difference, diagnose an abnormal state on the basis of a dispersed distribution at a midpoint of discharge magnitudes before and after a discharge in the analysis of the discharge magnitude difference, diagnose an abnormal state on the basis of maximum and average discharge magnitudes in the analysis of the maximum and average discharge magnitudes, and diagnose an abnormal state on the basis of whether a frequency band rises and the number of discharges in a rising frequency band in the analysis of the frequency band-specific discharge numbers.

In other words, the first partial discharge diagnosis unit 410 may primarily diagnose whether the HVDC cable is in a normal state or an abnormal state through individual pattern analysis of 10 items shown in Table 1.

TABLE 1

| | Analysis item | Abnormality judgment | | |
| | | Phenomenon | Judgment | Normal state |
| --- | --- | --- | --- | --- |
| P1 | Discharge trend | Discharge magnitude and frequency drastically increase | Abnormal | Discharge magnitude and frequency are constant |
| P2 | 10-minute cumulative discharge amount | Cumulative discharge amount drastically increases | Abnormal | Cumulative discharge amount is constant |
| P3 | 1-minute cumulative discharge amount | Cumulative discharge amount drastically increases | Abnormal | Cumulative discharge amount is constant |

TABLE 1-continued

| | | Abnormality judgment | | |
|---|---|---|---|---|
| | Analysis item | Phenomenon | Judgment | Normal state |
| P4 | Class-specific discharge number | Discharge class rises, and discharge number increases | Abnormal | Discharge class and discharge number are constant |
| P5 | Discharge time difference | Discharge time difference before and after discharge decreases before and after discharge | Abnormal | Discharge time difference is constant |
| P6 | Discharge time difference – discharge magnitude | Discharge magnitude increases, and discharge time difference drastically decreases | Abnormal | Cumulative discharge amount is constant |
| P7 | Average discharge time difference | Average discharge time difference increases | Abnormal | Average discharge time difference decreases |
| P8 | Discharge magnitude difference | Dispersed distribution at midpoint of discharge magnitudes before and after discharge | Abnormal | Discharge magnitudes converge on midpoint |
| P9 | Maximum/average discharge magnitude | Maximum/average discharge magnitudes increase | Abnormal | Maximum/average discharge magnitudes are constant |
| P10 | Frequency band-specific discharge number | Frequency band rises | Abnormal | Frequency band falls |

In the analysis of an HVDC cable discharge magnitude trend, the first partial discharge diagnosis unit 410 may diagnose an abnormal state when a discharge magnitude and frequency drastically increase. Here, the first partial discharge diagnosis unit 410 may set a trigger level for a discharge magnitude and diagnose an abnormal state when the number of discharges of which magnitudes exceed a set trigger level value exceeds a critical value.

The first partial discharge diagnosis unit 410 may set the trigger level by multiplying an average of maximum discharge magnitudes for an immediately previous time period by a certain weight. In other words, the first partial discharge diagnosis unit 410 may set the trigger level using Expression 1 below.

Average of maximun discharge magnitudes     [Expression 1]

for certain time period × weight factor (%)

The first partial discharge diagnosis unit 410 may set the trigger level using Expression 1, or a user may directly input and set the trigger level.

The first partial discharge diagnosis unit 410 may diagnose an abnormal state on the basis of Expression 2 below.

$$N(\text{Max}(\text{Trigger})) > n_{setting}$$     [Expression 2]

In other words, when the number of discharges of which magnitudes exceed a maximum trigger level value exceeds a set value $n_{setting}$, the first partial discharge diagnosis unit 410 may determine that it is an abnormal state. Here, whether the number of discharges exceeds the set value $n_{setting}$ may be determined using a value accumulated for a certain time period. When the number of discharges does not exceed the set value $n_{setting}$ within the certain time period, counting of a cumulative discharge number may be initialized.

The first partial discharge diagnosis unit 410 may output a diagnosis result based on individual pattern analysis of a partial discharge trend through the output unit 440 as shown in FIGS. 3A and 3B. FIG. 3A shows a diagnosis implementation screen based on individual pattern analysis of a discharge magnitude trend, and FIG. 3B shows an example of diagnosis implementation based on individual pattern analysis of a discharge magnitude trend. Referring to FIGS. 3A and 3B, the first partial discharge diagnosis unit 410 may set a trigger level (①) for a discharge magnitude. When the number of discharges having the trigger level or higher exceeds the critical value, the first partial discharge diagnosis unit 410 may change a diagnostic signal (②) from a normal signal (green) to an abnormal signal (red) and output the abnormal signal.

In the analysis of 1-minute cumulative discharge amounts, the first partial discharge diagnosis unit 410 may diagnose an abnormal state when the cumulative number of discharges drastically increases. Here, the first partial discharge diagnosis unit 410 diagnoses an abnormal state when a current 1-minute cumulative discharge amount exceeds twice the average of 1-minute discharge amounts for a certain time period as shown in Expression 3 below and repeats this for a certain time period (e.g., to 15 minutes).

$$\text{Average(1-minute cumulative discharge amount for set time period)} \times 2 < \text{current 1-minute cumulative discharge amount} \quad \text{[Expression 3]}$$

The first partial discharge diagnosis unit 410 may output a diagnosis result based on individual pattern analysis of 1-minute cumulative discharge amounts through the output unit 440 as shown in FIGS. 4A and 4B. FIG. 4A shows a diagnosis implementation screen based on individual pattern analysis of 1-minute cumulative discharge amounts, and FIG. 4B shows an example of diagnosis implementation based on individual pattern analysis of 1-minute cumulative discharge amounts.

Referring to FIGS. 4A and 4B, when a current 1-minute cumulative discharge amount exceeds twice the average of 1-minute discharge amounts for a certain time period and repeats this for a certain time period (e.g., 10 to 15 minutes), the first partial discharge diagnosis unit 410 may change a diagnostic signal (①) from a normal signal (green) to an attention signal (orange). When this state exceeds a certain time (e.g., 15 minutes), the first partial discharge diagnosis unit 410 may automatically change the diagnostic signal (①) to an abnormal signal (red) and output the abnormal signal.

In the analysis of 10-minute cumulative discharge amounts, the first partial discharge diagnosis unit 410 may diagnose an abnormal state when the cumulative number of discharges drastically increases. Here, the first partial discharge diagnosis unit 410 diagnoses an abnormal state when a current 10-minute cumulative discharge amount exceeds twice the average of 10-minute discharge amounts for a certain time period as shown in Expression 4 below and repeats this for a certain time period (e.g., to 30 minutes).

$$\text{Average(10-minute cumulative discharge amount for set time period)} \times 2 < \text{current 10-minute cumulative discharge amount} \quad \text{[Expression 4]}$$

The first partial discharge diagnosis unit 410 may output a diagnosis result based on individual pattern analysis of 10-minute cumulative discharge amounts through the output unit 440 as shown in FIGS. 5A and 5B. FIG. 5A shows a diagnosis implementation screen based on individual pattern analysis of 10-minute cumulative discharge amounts, and FIG. 5B shows an example of diagnosis implementation based on individual pattern analysis of 10-minute cumulative discharge amounts. Referring to FIGS. 5A and 5B, when a current 10-minute cumulative discharge amount exceeds twice the average of 10-minute discharge amounts for a certain time period and repeats this for a certain time period (e.g., 15 to 30 minutes), the first partial discharge diagnosis unit 410 may change a diagnostic signal (①) from a normal signal (green) to an attention signal (orange). When this state exceeds a certain time (e.g., 30 minutes), the first partial discharge diagnosis unit 410 may automatically change the diagnostic signal (①) to an abnormal signal (red) and output the abnormal signal.

In the analysis of class-specific discharge numbers, the first partial discharge diagnosis unit 410 may diagnose an abnormal state by detecting a rise in a discharge class and an increase in class-specific discharge numbers. For example, a diagnosis based on individual pattern analysis of class-specific discharge numbers will be described with reference to FIGS. 6A and 6B. In the individual pattern analysis of class-specific discharge numbers, the first partial discharge diagnosis unit 410 may classify a cumulative discharge magnitude of each certain time period (e.g., one hour) into a discharge magnitude class Class 1 to Class N (②) and map class-specific cumulative discharge numbers (③). When a discharge class rises by certain levels and the number of discharges exceeds the discharge number $n_{setting}$ set for the risen discharge class, the first partial discharge diagnosis unit 410 may automatically change a diagnostic signal (①) from a normal signal (green) to an abnormal signal (red) and output the abnormal signal. Here, the class-specific discharge numbers may be automatically set on the basis of measured data or directly input by the user.

In the analysis of discharge time differences, the first partial discharge diagnosis unit 410 may diagnose an abnormal phenomenon on the basis of a drastic reduction in discharge time difference. In the case of measuring a partial discharge, the analysis of discharge time differences may be a method of diagnosing a partial discharge by mapping a time difference (x axis) between a time point of partial discharge occurrence and an immediately previous discharge and a time difference (y axis) between the time point of the partial discharge occurrence and an immediately subsequent discharge.

Accordingly, the first partial discharge diagnosis unit 410 may set a trigger level for a discharge time difference and diagnose an abnormal state when measured data exceeds the set discharge number $n_{setting}$ within the trigger level range as shown in Expression 5 below.

$$\text{Total number of discharges within trigger range} > n_{setting} \quad \text{[Expression 5]}$$

The first partial discharge diagnosis unit 410 may set the trigger level for discharge time differences through the user in consideration of an actual system operation environment and discharge characteristics. Also, the first partial discharge diagnosis unit 410 may automatically set the trigger level for discharge time differences on the basis of data under normal state operation conditions.

The first partial discharge diagnosis unit 410 may output a diagnosis result based on individual pattern analysis of discharge time differences through the output unit 440 as shown in FIGS. 7A and 7B. FIG. 7A shows a diagnosis implementation screen based on individual pattern analysis of discharge time differences, and FIG. 7B shows an example of diagnosis implementation based on individual pattern analysis of discharge time differences. Referring to FIGS. 7A and 7B, the first partial discharge diagnosis unit 410 may set a trigger level (②) for discharge time differences. When measured data exceeds the set discharge number $n_{setting}$ within the trigger level range (③), the first partial discharge diagnosis unit 410 may change a diagnostic signal (①) from a normal signal (green) to an abnormal signal (red) and output the abnormal signal.

In the analysis of a relationship between a discharge time difference and a discharge magnitude, the first partial discharge diagnosis unit 410 may diagnose an abnormal phenomenon on the basis of a phenomenon in which a time difference is reduced with an increase in a discharge magnitude. In the case of measuring a partial discharge, the analysis of a relationship between a discharge time difference and a discharge magnitude may be a method of diagnosing a partial discharge by mapping a time difference (x axis) between a time point of partial discharge occurrence and an immediately previous discharge and a time difference (y axis) between the time point of the partial discharge occurrence and an immediately subsequent discharge.

Accordingly, the first partial discharge diagnosis unit 410 may set a trigger level for a discharge time difference on the basis of a discharge immediately before or immediately after a time point of partial discharge occurrence and diagnose an abnormal state when measured data exceeds the set discharge number $n_{setting}$ within the trigger level range as shown in Expression 6 below.

$$\text{Total number of discharges within trigger range} > n_{setting} \quad \text{[Expression 6]}$$

The first partial discharge diagnosis unit 410 may set the trigger level for discharge time differences through the user in consideration of an actual system operation environment and discharge characteristics. Also, the first partial discharge diagnosis unit 410 may automatically set the trigger level for discharge time differences on the basis of data under normal state operation conditions.

The first partial discharge diagnosis unit 410 may output a diagnosis result based on individual pattern analysis of the relationship between a discharge time difference and a discharge magnitude through the output unit 440 as shown in FIGS. 8A and 8B. FIG. 8A shows a diagnosis implementation screen based on individual pattern analysis of the relationship between a discharge time difference and a discharge magnitude, and FIG. 8B shows an example of diagnosis implementation based on individual pattern analysis of the relationship between a discharge time difference and a discharge magnitude. Referring to FIGS. 8A and 8B, the first partial discharge diagnosis unit 410 may set a trigger level (②) for discharge time differences. When measured data exceeds the set discharge number $n_{setting}$ within the trigger level range (③), the first partial discharge diagnosis unit 410 may change a diagnostic signal (①) from a normal signal (green) to an abnormal signal (red) and output the abnormal signal.

In the analysis of an average discharge time, the first partial discharge diagnosis unit 410 may diagnose an abnormal phenomenon by detecting a phenomenon in which an average discharge time difference increases. Here, the first partial discharge diagnosis unit 410 may analyze an average discharge time difference between set time regions (e.g., at one-hour intervals) and diagnose an abnormal state when a current set time average discharge time difference is larger than the quotient of a certain-time average (e.g., a two-hour average) divided by a weight factor as shown in Expression 7 below.

$$\frac{\text{previous certain-time average time difference}}{\text{factor (\%)}} < \text{current set-time average time difference} \quad \text{[Expression 7]}$$

The first partial discharge diagnosis unit 410 may output a diagnosis result based on individual pattern analysis of average discharge time differences through the output unit 440 as shown in FIGS. 9A and 9B. FIG. 9A shows a diagnosis implementation screen based on individual pattern analysis of average discharge time differences, and FIG. 9B shows an example of diagnosis implementation based on individual pattern analysis of average discharge time differences. Referring to FIGS. 9A and 9B, when a current designated-time average discharge time difference is larger than the quotient of a certain-time average (e.g., a two-hour average) divided by a factor, the first partial discharge diagnosis unit 410 may change a diagnostic signal ((①) from a normal signal (green) to an abnormal signal (red) and output the abnormal signal.

In the analysis of discharge magnitude differences, the first partial discharge diagnosis unit 410 may detect an abnormal phenomenon using a distribution in which a discharge magnitude is dispersed from the center before and after a discharge, and may diagnose an abnormal phenomenon when maximum and average discharge magnitudes increase. In the case of measuring a partial discharge, the first partial discharge diagnosis unit 410 may diagnose a partial discharge by mapping a discharge magnitude difference (x axis) between a time point of partial discharge occurrence and an immediately previous discharge and a time difference (y axis) between the time point of the partial discharge occurrence and an immediately subsequent discharge.

The first partial discharge diagnosis unit 410 may output a diagnosis result based on individual pattern analysis of discharge magnitude differences through the output unit 440 as shown in FIGS. 10A and 10B. FIG. 10A shows a diagnosis implementation screen based on individual pattern analysis of discharge magnitude differences, and FIG. 10B shows an example of diagnosis implementation based on individual pattern analysis of discharge magnitude differences. Referring to FIGS. 10A and 10B, a trigger level (②) for a discharge time difference may be designated by the user in consideration of an actual system operation environment and discharge characteristics, or may be automatically set on the basis of data under normal state operation conditions. After the trigger level is set, when measured data exceeds the set discharge number $n_{setting}$ out of the trigger level range (③) as shown in Expression 8 below, the first partial discharge diagnosis unit 410 may change a diagnostic signal (①) from a normal signal (green) to an abnormal signal (red) and output the abnormal signal. Here, the set value $n_{setting}$ may be automatically set on the basis of the measured data or directly set by the user for running.

$$N(\text{Outside trigger range}) > n_{setting} \quad \text{[Expression 8]}$$

In the analysis of maximum/average discharge magnitudes, the first partial discharge diagnosis unit 410 may diagnose an abnormal state on the basis of maximum and average discharge magnitudes. Here, when a current value is higher than the product of a certain factor (e.g., 1.5) and an average of average discharge magnitudes (or maximum discharge magnitudes) during a certain time period (e.g., two hours) as shown in Expression 9 below, the first partial discharge diagnosis unit 410 may diagnose an abnormal state.

$$\text{Average(maximum discharge magnitudes} \\ \text{or average discharge magnitudes during set time period)} \times \\ \text{factor} < \text{current value} \quad \text{[Expression 9]}$$

The first partial discharge diagnosis unit 410 may output a diagnosis result based on individual pattern analysis of maximum/average discharge magnitudes through the output unit 440 as shown in FIGS. 11A and 11B. FIG. 11A shows a diagnosis implementation screen based on individual pattern analysis of maximum/average discharge magnitudes, and FIG. 11B shows an example of diagnosis implementation based on individual pattern analysis of maximum/average discharge magnitudes. Referring to FIGS. 11A and 11B, maximum/average discharge magnitudes are mapped in units of a certain time (e.g., one hour). When a current value is higher than the product of an average of average discharge magnitudes (②) or maximum discharge magnitudes (③) during a set time period (e.g., two hours) and a certain factor (e.g., 1.5) as shown in Expression 9, the first partial discharge diagnosis unit 410 may change a diagnostic signal (①) from a normal signal (green) to an attention signal (orange) with the current value lasting for a first certain time period (e.g., one hour) and automatically change the diagnostic signal to an abnormal signal (red) and output the abnormal signal with the current value repeated for more than the certain time period.

The first partial discharge diagnosis unit 410 may diagnose a partial discharge through individual pattern analysis of the number of discharges in each frequency band of a discharge waveform. In this case, when an abnormal phenomenon occurs, a frequency band rises, and the number of discharges in the risen frequency band also increases.

The first partial discharge diagnosis unit 410 may output a diagnosis result based on individual pattern analysis of the number of discharges in each frequency band of a discharge waveform through the output unit 440 as shown in FIGS. 12A and 12B. FIG. 12A shows a diagnosis implementation screen based on individual pattern analysis of the number of discharges in each frequency band of a discharge waveform, and FIG. 12B shows an example of diagnosis implementation based on individual pattern analysis of the number of discharges in each frequency band of a discharge waveform. Referring to FIGS. 12A and 12B, in individual pattern analysis of the number of discharges in each frequency band, the first partial discharge diagnosis unit 410 may classify a cumulative discharge waveform of each certain time period (e.g., one hour) into a frequency band class Class 1 to Class N (②) and map frequency band class-specific cumulative discharge numbers (③). When a frequency band class rises by certain levels and the number of discharges exceeds the discharge number $n_{setting}$ set for the risen frequency band class, a diagnostic signal (①) may be automatically changed from a normal signal (green) to an abnormal signal (red). Here, the discharge number $n_{setting}$ may be automatically set on the basis of measured data or directly input by the user for running.

The first partial discharge diagnosis unit 410 may make and output a primary partial discharge diagnosis through pattern analysis of at least one of a discharge magnitude trend, a 10-minute cumulative discharge amount, a 1-minute cumulative discharge amount, class-specific discharge numbers, a discharge time difference, the relationship between the discharge time difference and the discharge magnitude, an average discharge time difference, a discharge magnitude difference, maximum/average discharge magnitudes, and frequency band-specific discharge numbers.

Referring back to FIG. 2, the second partial discharge diagnosis unit 420 may make a secondary partial discharge diagnosis through pattern analysis of at least one of a discharge magnitude function group, a discharge time difference function group, a composite function group of discharge magnitude and discharge time difference, and a discharge waveform frequency function group.

A method for the second partial discharge diagnosis unit 420 to make a secondary partial discharge diagnosis through group pattern analysis will be described below.

The second partial discharge diagnosis unit 420 may generate discharge magnitude function groups by grouping individual partial discharge diagnosis results based on a discharge trend, a 10-minute cumulative discharge amount, a 1-minute cumulative discharge amount, and class-specific discharge numbers and make a secondary partial discharge diagnosis using the discharge magnitude function groups. Here, the second partial discharge diagnosis unit 420 may give a preset impact factor to a diagnosis result of each of the discharge trend, the 10-minute cumulative discharge amount, the 1-minute cumulative discharge amount, and the class-specific discharge numbers and diagnose whether the HVDC cable is abnormal on the basis of each diagnosis result to which the impact factor is given.

A method for the second partial discharge diagnosis unit 420 to make a secondary partial discharge diagnosis using a discharge magnitude function group will be described with reference to FIGS. 13A to 13C. FIG. 13A is a conceptual diagram of a diagnosis based on pattern analysis of a discharge magnitude function group (group 1), FIG. 13B is a diagram of a diagnosis implementation screen based on group pattern analysis of the discharge magnitude function group (group 1), and FIG. 13C is a diagram illustrating diagnosis implementation based on group pattern analysis of the discharge magnitude function group (group 1). As shown in FIG. 13A, the second partial discharge diagnosis unit 420 may give impact factors (impact levels (classes)) of A, B, and C to individual partial discharge diagnosis results. For example, A class may be given to diagnosis results of the discharge trend, the 10-minute cumulative discharge amount, and the 1-minute cumulative discharge amount, and B class may be given to a diagnosis result of the class-specific discharge numbers. An impact factor of each individual partial discharge diagnosis result may be set in advance. After that, in the case of diagnosing an abnormal signal in A class partial discharge diagnoses of ①, ②, and ③ in FIG. 13B, the second partial discharge diagnosis unit 420 may output a diagnosis result of the discharge magnitude function group (group 1) of ⑤ using an abnormal signal (red). However, in the case of diagnosing an abnormal signal in a B class partial discharge diagnosis of ④ in FIG. 13B, when B class diagnosis elements are mixed with one or more A class diagnosis elements, the second partial discharge diagnosis unit 420 may output a diagnosis result of the discharge magnitude function group (group 1) of ⑤ using an abnormal signal (red).

Also, the second partial discharge diagnosis unit 420 may generate a discharge time difference function group by grouping individual partial discharge diagnosis results based on a discharge time difference, the relationship between the discharge time difference and the discharge magnitude, and an average discharge time difference and make a secondary partial discharge diagnosis using the discharge time difference function group. Here, the second partial discharge diagnosis unit 420 may give a preset impact factor to a diagnosis result of each of the discharge time difference, the relationship between the discharge time difference and the discharge magnitude, and the average discharge time difference and diagnose whether the HVDC cable is abnormal on the basis of each diagnosis result to which the impact factor is given. Here, an impact factor of each of the discharge time difference, the relationship between the discharge time difference and the discharge magnitude, and the average discharge time difference may be set in advance.

A method for the second partial discharge diagnosis unit 420 to make a secondary partial discharge diagnosis using a discharge time difference function group will be described with reference to FIGS. 14A to 14C. FIG. 14A is a conceptual diagram of a diagnosis based on pattern analysis of a discharge time difference function group (group 2), FIG. 14B is a diagram of a diagnosis implementation screen based on group pattern analysis of the discharge time difference function group (group 2), and FIG. 14C is a diagram illustrating diagnosis implementation based on group pattern analysis of the discharge time difference function group (group 2). As shown in FIG. 14A, the second partial discharge diagnosis unit 420 may give an impact factor to each individual partial discharge diagnosis result. For example, B class may be given to the discharge time difference, A class may be given to the relationship between the discharge time difference and the discharge magnitude, and C class may be given to the average discharge time difference. In the case of diagnosing an abnormal signal in an A class partial discharge diagnosis of ②, the second partial discharge diagnosis unit 420 may output a diagnosis result of the discharge time difference function group (group 2) of ④ using an abnormal signal (red). However, in the case of diagnosing an abnormal signal in B and C class partial discharge diagnoses of ① and ③, when B and C class diagnosis elements are mixed with one or more A class diagnosis elements, the second partial discharge diagnosis unit 420 may output a diagnosis result of the discharge time difference function group (group 2) of ④ using an abnormal signal (red).

Also, the second partial discharge diagnosis unit 420 may generate composite function groups of discharge magnitude and discharge time difference by grouping individual partial discharge diagnosis results based on a discharge magnitude difference and maximum/average discharge magnitudes and make a secondary partial discharge diagnosis using the composite function groups of discharge magnitude and discharge time difference. Here, the second partial discharge diagnosis unit 420 may give a preset impact factor to a diagnosis result of each of the discharge time difference and the maximum/average discharge magnitudes and diagnose whether the HVDC cable is abnormal on the basis of each diagnosis result to which the impact factor is given. Here, an impact factor of each of the discharge time difference and the maximum/average discharge magnitudes may be set in advance.

A method for the second partial discharge diagnosis unit 420 to make a secondary partial discharge diagnosis using a composite function group (group 3) of discharge magnitude and discharge time difference will be described with reference to FIGS. 15A to 15C. FIG. 15A is a conceptual diagram of a diagnosis based on pattern analysis of the composite function group (group 3) of discharge magnitude and discharge time difference, FIG. 15B is a diagram of a diagnosis implementation screen based on group pattern analysis of the composite function group (group 3) of discharge magnitude and discharge time difference, and FIG. 15C is a diagram illustrating diagnosis implementation based on group pattern analysis of the composite function group (group 3) of discharge magnitude and discharge time difference. As shown in FIG. 15A, the second partial discharge diagnosis unit 420 may give an impact factor to each individual partial discharge diagnosis result. For example, A class may be given to each of diagnosis results of the discharge magnitude difference and the maximum/average discharge magnitudes. After that, in the case of diagnosing an abnormal signal in A class partial discharge diagnoses of ① and ②, the second partial discharge diagnosis unit 420 may output a diagnosis result of the composite function group (group 3) of discharge magnitude and discharge time difference of ③ using an abnormal signal (red).

Also, the second partial discharge diagnosis unit 420 may generate discharge waveform frequency function groups by grouping individual partial discharge diagnosis results based on frequency band-specific discharge numbers and make a secondary partial discharge diagnosis using the discharge waveform frequency function groups. Here, the second partial discharge diagnosis unit 420 may give a preset impact factor to a diagnosis result of each individual partial discharge diagnosis result.

The second partial discharge diagnosis unit 420 may make a secondary partial discharge diagnosis through pattern analysis of at least one of the discharge magnitude function groups, the discharge time difference function groups, the composite function groups of discharge magnitude and discharge time difference, and the discharge waveform frequency function groups and output a secondary partial discharge diagnosis result as shown in FIG. 16.

The final diagnosis unit 430 may diagnose a partial discharge of the HVDC cable on the basis of the primary partial discharge diagnosis result and the secondary partial discharge diagnosis result.

When all the groups are determined to be normal in secondary partial discharge diagnoses, the final diagnosis unit 430 may diagnose the HVDC cable as normal. Also, when one group or individual partial discharge diagnoses are determined with one or more abnormal signals, the final diagnosis unit 430 may output an attention signal. Also, when two or more groups are determined to be in an abnormal state, the final diagnosis unit 430 may finally diagnose the HVDC cable with an abnormal state.

The final diagnosis unit 430 may output the HVDC cable partial discharge diagnosis result. For example, when all groups are determined to be normal, the final diagnosis unit 430 may output a normal signal (green). When one group or individual partial discharge diagnoses are determined with one or more abnormal signals, the final diagnosis unit 430 may output an attention signal (orange). Also, when two or more groups are diagnosed with an abnormal signal, the final diagnosis unit 430 may output an abnormal signal (red).

The output unit 440 may output at least one of the primary partial discharge diagnosis result, the secondary partial discharge diagnosis result, and the final diagnosis result. The output unit 440 may be implemented as, for example, a liquid crystal display (LCD) or the like.

Figure 17:
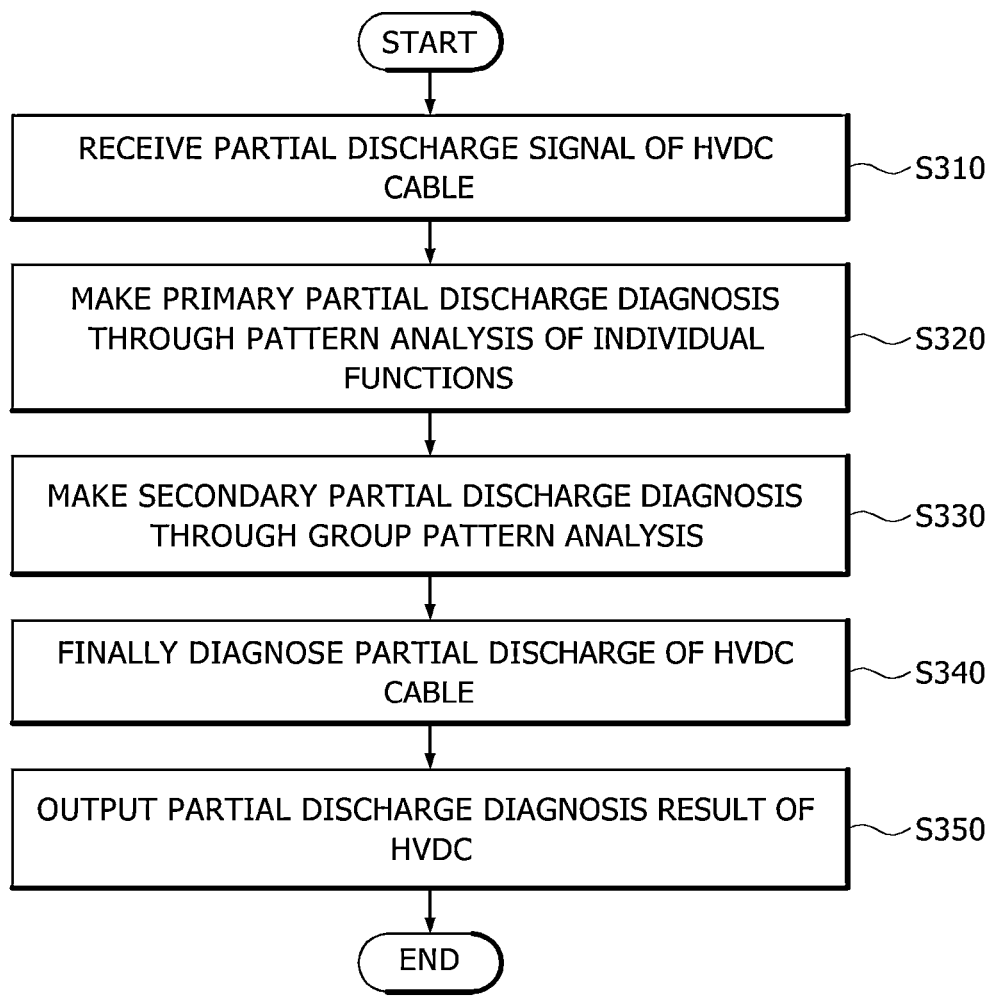
FIG. 17 is a flowchart illustrating an HVDC cable partial discharge diagnosis method according to an embodiment of the present invention.

FIG. 17 is a flowchart illustrating an HVDC cable partial discharge diagnosis method according to an embodiment of the present invention.

Referring to FIG. 17, the partial discharge diagnosis device 400 receives a partial discharge signal from the partial discharge measurement devices 200 (S310) and makes a primary partial discharge diagnosis through pattern analysis of individual functions of items predefined for the partial discharge signal (S320). Here, the partial discharge diagnosis device 400 may make the primary partial discharge diagnosis through individual pattern analysis of at least one of a discharge magnitude trend, a 10-minute cumulative discharge amount, a 1-minute cumulative discharge amount, class-specific discharge numbers, a discharge time difference, the relationship between the discharge time difference and a discharge magnitude, an average discharge time difference, a discharge magnitude difference, maximum/average discharge magnitudes, and frequency band-specific discharge numbers.

When the operation S320 is performed, the partial discharge diagnosis device 400 makes a secondary partial discharge diagnosis through pattern analysis of at least one of a discharge magnitude function group, a discharge time difference function group, a composite function group of discharge magnitude and discharge time difference, and a discharge waveform frequency function group (S330).

The partial discharge diagnosis device 400 may generate discharge magnitude function groups by grouping individual partial discharge diagnosis results based on a discharge trend, a 10-minute cumulative discharge amount, a 1-minute cumulative discharge amount, and class-specific discharge numbers and make a secondary partial discharge diagnosis using the discharge magnitude function groups. The partial discharge diagnosis device 400 may generate discharge time difference function groups by grouping individual partial discharge diagnosis results based on a discharge time difference, the relationship between the discharge time difference and the discharge magnitude, and an average discharge time difference and make a secondary partial discharge diagnosis using the discharge magnitude function groups. The partial discharge diagnosis device 400 may generate composite function groups of discharge magnitude and discharge time difference by grouping individual partial discharge diagnosis results based on a discharge magnitude difference and maximum/average discharge magnitudes and make a secondary partial discharge diagnosis using the composite function groups of discharge magnitude and discharge time difference. The partial discharge diagnosis device 400 may generate discharge waveform frequency function groups by grouping individual partial discharge diagnoses of frequency band-specific discharge numbers and make a secondary partial discharge diagnosis using the discharge waveform frequency function groups.

When operation S330 is performed, the partial discharge diagnosis device 400 finally diagnoses a partial discharge of an HVDC cable on the basis of the primary partial discharge diagnosis result and the secondary partial discharge diagnosis result (S340) and outputs a partial discharge diagnosis result (S350). Here, when all groups are determined to be normal in the secondary partial discharge diagnosis, the partial discharge diagnosis device 400 may diagnose the HVDC cable as normal. When one group or individual partial discharge diagnoses are determined with one or more abnormal signals, the partial discharge diagnosis device 400 may output an attention signal. Also, when two or more groups are diagnosed with an abnormal state, the partial discharge diagnosis device 400 may finally diagnose the HVDC cable with an abnormal state.

As described above, with an HVDC cable partial discharge diagnosis system and method according to an embodiment of the present invention, it is possible to diagnose a partial discharge of an HVDC cable by analyzing a pattern of an HVDC cable partial discharge signal analyzed through partial discharge measurement of the HVDC cable.

Although the present invention has been described with reference to embodiments shown in the drawings, these are only illustrative, and those of ordinary skill in the art should understand that various modifications and other embodiments equivalent to the embodiments are possible without departing from the embodiments.

Therefore, the technical scope of the present invention should be determined according to the following claims.

What is claimed:

1. A high-voltage direct current (HVDC) cable partial discharge diagnosis system comprising:
   sensors installed on an HVDC cable;
   a plurality of HVDC cable partial discharge measurement devices configured to acquire measurement result information from the sensors and detect a partial discharge signal from the measurement result information; and
   an HVDC cable partial discharge diagnosis device configured to receive the partial discharge signal from the HVDC cable partial discharge measurement devices and diagnose whether there is a partial discharge in the HVDC cable through pattern analysis of the partial discharge signal,
   wherein the HVDC cable partial discharge diagnosis device comprises:
   a first partial discharge diagnosis unit configured to make a primary partial discharge diagnosis through pattern analysis of individual functions of predefined items;
   a second partial discharge diagnosis unit configured to make a secondary partial discharge diagnosis through pattern analysis of at least one of a discharge magnitude function group, a discharge time difference function group, a composite function group of discharge magnitude and discharge time difference, and a discharge waveform frequency function group; and
   a final diagnosis unit configured to diagnose a partial discharge of the HVDC cable on the basis of a result of the primary partial discharge diagnosis and a result of the secondary partial discharge diagnosis.

2. The HVDC cable partial discharge diagnosis system of claim 1, wherein the first partial discharge diagnosis unit makes the primary partial discharge diagnosis through pattern analysis of at least one of a discharge magnitude trend, a 10-minute cumulative discharge amount, a 1-minute cumulative discharge amount, class-specific discharge numbers, a discharge time difference, a relationship between the discharge time difference and a discharge magnitude, an average discharge time difference, a discharge magnitude difference, maximum/average discharge magnitudes, and frequency band-specific discharge numbers.

3. The HVDC cable partial discharge diagnosis system of claim 2, wherein the first partial discharge diagnosis unit diagnoses an abnormal state on the basis of the discharge magnitude and a discharge frequency in analysis of the discharge magnitude trend, diagnoses an abnormal state on the basis of a cumulative discharge number in analysis of the 1-minute and 10-minute cumulative discharge amounts, diagnoses an abnormal state on the basis of a discharge class and the class-specific discharge numbers in analysis of the class-specific discharge numbers, diagnoses an abnormal state on the basis of a time difference (x axis) between a time point of partial discharge occurrence and an immediately previous discharge and a time difference (y axis) between the time point of the partial discharge occurrence and an immediately subsequent discharge in analysis of the discharge time difference, diagnoses an abnormal state on the basis of a time difference (x axis) between a time point of partial discharge occurrence and an immediately previous or subsequent discharge and a discharge magnitude (y axis) in analysis of the relationship between the discharge time difference and the discharge magnitude, diagnoses an abnormal state on the basis of the average discharge time difference in analysis of the average discharge time difference, diagnoses an abnormal state on the basis of a dispersed distribution at a midpoint of discharge magnitudes before and after a discharge in analysis of the discharge magnitude difference, diagnoses an abnormal state on the basis of maximum and average discharge magnitudes in analysis of the maximum and average discharge magnitudes, and diagnoses an abnormal state on the basis of whether a frequency band rises and the number of discharges in a risen frequency band in analysis of the frequency band-specific discharge numbers.

4. The HVDC cable partial discharge diagnosis system of claim 1, wherein the second partial discharge diagnosis unit generates discharge magnitude function groups by grouping individual partial discharge diagnosis results based on a discharge trend, a 10-minute cumulative discharge amount, a 1-minute cumulative discharge amount, and class-specific discharge numbers, makes a secondary partial discharge diagnosis using the discharge magnitude function groups, gives a preset impact factor to a diagnosis result of each of the discharge trend, the 10-minute cumulative discharge amount, the 1-minute cumulative discharge amount, and the class-specific discharge numbers, and diagnoses whether the HVDC cable is abnormal on the basis of each diagnosis result to which the impact factor is given.

5. The HVDC cable partial discharge diagnosis system of claim 1, wherein the second partial discharge diagnosis unit generates discharge time difference function groups by grouping individual partial discharge diagnosis results based on a discharge time difference, a relationship between the discharge time difference and a discharge magnitude, and an average discharge time difference, makes a secondary partial discharge diagnosis using the discharge time difference function groups, gives a preset impact factor to a diagnosis result of each of the discharge time difference, the relationship between the discharge time difference and the discharge magnitude, and the average discharge time difference, and diagnoses whether the HVDC cable is abnormal on the basis of each diagnosis result to which the impact factor is given.

6. The HVDC cable partial discharge diagnosis system of claim 1, wherein the second partial discharge diagnosis unit generates composite function groups of discharge magnitude and discharge time difference by grouping individual partial discharge diagnosis results based on a discharge magnitude difference and maximum/average discharge magnitudes, makes a secondary partial discharge diagnosis using the composite function groups of discharge magnitude and discharge time difference, gives a preset impact factor to a diagnosis result of each of the discharge magnitude difference and the maximum/average discharge magnitudes, and diagnoses whether the HVDC cable is abnormal on the basis of each diagnosis result to which the impact factor is given.

7. The HVDC cable partial discharge diagnosis system of claim 1, wherein the second partial discharge diagnosis unit generates the discharge waveform frequency function group by grouping individual partial discharge diagnoses of frequency band-specific discharge numbers and makes a secondary partial discharge diagnosis using the discharge waveform frequency function group.

8. The HVDC cable partial discharge diagnosis system of claim 1, further comprising an output unit configured to output at least one of a result of the primary partial discharge diagnosis, a result of the secondary partial discharge diagnosis, and a final diagnosis result.

9. The HVDC cable partial discharge diagnosis system of claim 1, wherein the HVDC cable partial discharge diagnosis device comprises at least one of a real-time partial discharge diagnosis device configured to make a diagnosis at all times and a portable partial discharge diagnosis device configured to make a diagnosis at a specific location during a specific time period.

10. The HVDC cable partial discharge diagnosis system of claim 1, further comprising a master station configured to manage state information of the plurality of HVDC cable partial discharge measurement devices and a partial discharge signal detected by each HVDC cable partial discharge measurement device and store a partial discharge diagnosis result of the HVDC cable diagnosed by the HVDC cable partial discharge diagnosis device.

11. A high-voltage direct current (HVDC) cable partial discharge diagnosis method, comprising:
  acquiring, by HVDC cable partial discharge measurement devices, measurement result information from sensors installed on an HVDC cable and detecting a partial discharge signal from the measurement result information; and
  receiving, by an HVDC cable partial discharge diagnosis device, the partial discharge signal from the HVDC cable partial discharge measurement devices and diagnosing whether there is a partial discharge in the HVDC cable through pattern analysis of the partial discharge signal,
  wherein the diagnosing of whether there is a partial discharge in the HVDC cable comprises:
  making, by the HVDC cable partial discharge diagnosis device, a primary partial discharge diagnosis through pattern analysis of individual functions of predefined items;
  making, by the HVDC cable partial discharge diagnosis device, a secondary partial discharge diagnosis through pattern analysis of at least one of discharge magnitude function groups, discharge time difference function groups, composite function groups of discharge magnitude and discharge time difference, and discharge waveform frequency function groups; and
  diagnosing, by the HVDC cable partial discharge diagnosis device, a partial discharge of the HVDC cable on the basis of a result of the primary partial discharge diagnosis and a result of the secondary partial discharge diagnosis.

12. The HVDC cable partial discharge diagnosis method of claim 11, wherein the making of the primary partial discharge diagnosis comprises making, by the HVDC cable partial discharge diagnosis device, the primary partial discharge diagnosis through pattern analysis of at least one of a discharge magnitude trend, a 10-minute cumulative discharge amount, a 1-minute cumulative discharge amount, class-specific discharge numbers, a discharge time difference, a relationship between the discharge time difference and a discharge magnitude, an average discharge time difference, a discharge magnitude difference, maximum/average discharge magnitudes, and frequency band-specific discharge numbers.

13. The HVDC cable partial discharge diagnosis method of claim 12, wherein the making of the primary partial discharge diagnosis comprises diagnosing, by the HVDC cable partial discharge diagnosis device, an abnormal state on the basis of the discharge magnitude and a discharge frequency in analysis of the discharge magnitude trend, diagnosing an abnormal state on the basis of a cumulative discharge number in analysis of the 1-minute and 10-minute cumulative discharge amounts, diagnosing an abnormal state on the basis of a discharge class and the class-specific discharge numbers in analysis of the class-specific discharge numbers, diagnosing an abnormal state on the basis of a time difference (x axis) between a time point of partial discharge occurrence and an immediately previous discharge and a time difference (y axis) between the time point of the partial discharge occurrence and an immediately subsequent discharge in analysis of the discharge time difference, diagnosing an abnormal state on the basis of the time difference (x axis) between a time point of partial discharge occurrence and an immediately previous or subsequent discharge and a discharge magnitude (y axis) in analysis of the relationship between the discharge time difference and the discharge magnitude, diagnosing an abnormal state on the basis of the average discharge time difference in analysis of the average discharge time difference, diagnosing an abnormal state on the basis of a dispersed distribution at a midpoint of discharge magnitudes before and after a discharge in analysis of the discharge magnitude difference, diagnosing an abnormal state on the basis of maximum and average discharge magnitudes in analysis of the maximum and average discharge magnitudes, and diagnosing an abnormal state on the basis of whether a frequency band rises and the number of discharges in a risen frequency band in analysis of the frequency band-specific discharge numbers.

14. The HVDC cable partial discharge diagnosis method of claim 11, wherein the making of the second partial discharge diagnosis comprises generating, by the HVDC cable partial discharge diagnosis device, discharge magnitude function groups by grouping individual partial discharge diagnosis results based on a discharge trend, a 10-minute cumulative discharge amount, a 1-minute cumulative discharge amount, and class-specific discharge numbers, making a secondary partial discharge diagnosis using the discharge magnitude function groups, giving a preset impact factor to a diagnosis result of each of the discharge trend, the 10-minute cumulative discharge amount, the 1-minute cumulative discharge amount, and the class-specific discharge numbers, and diagnosing whether the HVDC cable is abnormal on the basis of each diagnosis result to which the impact factor is given.

15. The HVDC cable partial discharge diagnosis method of claim 11, wherein the making of the second partial discharge diagnosis comprises generating, by the HVDC cable partial discharge diagnosis device, discharge magnitude function groups by grouping individual partial discharge diagnosis results based on a discharge time difference, a relationship between the discharge time difference and a discharge magnitude, and an average discharge time difference, making a secondary partial discharge diagnosis using the discharge magnitude function groups, giving a preset impact factor to a diagnosis result of each of the discharge time difference, the relationship between the discharge time difference and the discharge magnitude, and the average discharge time difference, and diagnosing whether the HVDC cable is abnormal on the basis of each diagnosis result to which the impact factor is given.

16. The HVDC cable partial discharge diagnosis method of claim 11, wherein the making of the second partial discharge diagnosis comprises generating, by the HVDC cable partial discharge diagnosis device, composite function groups of discharge magnitude and discharge time difference by grouping individual partial discharge diagnosis results based on a discharge magnitude difference and maximum/average discharge magnitudes, making a secondary partial discharge diagnosis using the composite function groups of discharge magnitude and discharge time difference, giving a preset impact factor to a diagnosis result of each of the discharge magnitude difference and the maximum/average discharge magnitudes, and diagnosing whether the HVDC cable is abnormal on the basis of each diagnosis result to which the impact factor is given.

17. The HVDC cable partial discharge diagnosis method of claim 11, wherein the making of the second partial discharge diagnosis comprises generating, by the HVDC cable partial discharge diagnosis device, the discharge waveform frequency function groups by grouping individual partial discharge diagnoses of frequency band-specific discharge numbers and making a secondary partial discharge diagnosis using the discharge waveform frequency function groups.

18. The HVDC cable partial discharge diagnosis method of claim 11, further comprising outputting, by the HVDC cable partial discharge diagnosis device, a result of the primary partial discharge diagnosis, a result of the secondary partial discharge diagnosis, and a final diagnosis result.

* * * * *